United States Patent
Yamae et al.

(10) Patent No.: US 9,620,740 B2
(45) Date of Patent: Apr. 11, 2017

(54) ORGANIC ELECTROLUMINESCENCE ELEMENT AND LIGHTING DEVICE

(71) Applicant: PANASONIC INTELLECTUAL PROPERTY MANAGEMENT CO., LTD., Osaka (JP)

(72) Inventors: Kazuyuki Yamae, Nara (JP); Shin Okumura, Osaka (JP); Hitomichi Takano, Osaka (JP); Masuyuki Ota, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/433,873

(22) PCT Filed: Oct. 7, 2013

(86) PCT No.: PCT/JP2013/005947
§ 371 (c)(1),
(2) Date: Apr. 7, 2015

(87) PCT Pub. No.: WO2014/057647
PCT Pub. Date: Apr. 17, 2014

(65) Prior Publication Data
US 2015/0270512 A1    Sep. 24, 2015

(30) Foreign Application Priority Data

Oct. 11, 2012  (JP) .................................. 2012-226297
Jul. 25, 2013  (JP) .................................. 2013-154836

(51) Int. Cl.
*H01L 29/08*    (2006.01)
*H01L 51/52*    (2006.01)
(Continued)

(52) U.S. Cl.
CPC ...... *H01L 51/5275* (2013.01); *H01L 51/0096* (2013.01); *H01L 51/5036* (2013.01);
(Continued)

(58) Field of Classification Search
CPC ............. H01L 51/0096; H01L 51/5036; H01L 51/5206; H01L 51/5221; H01L 51/5246;
(Continued)

(56) References Cited

U.S. PATENT DOCUMENTS 6,195,142 B1 *  2/2001  Gyotoku ............. H01L 51/5237
                                                         313/504
7,957,621 B2    6/2011  Zhang et al.
(Continued)

FOREIGN PATENT DOCUMENTS

CN      102272973 A    12/2011
JP        2931211 B     8/1999
(Continued)

OTHER PUBLICATIONS

Search Report issued by E.P.O. patent office in E.P.O. Patent Application No. 13845710.6, dated Nov. 12, 2015.
(Continued)

*Primary Examiner* — William F Kraig
*Assistant Examiner* — Khatib Rahman
(74) *Attorney, Agent, or Firm* — Greenblum & Bernstein, P.L.C.

(57) ABSTRACT

The organic electroluminescence element includes: a moisture-proof substrate; a light emitting stack including a first electrode, a light emitting layer, and a second electrode; and an enclosing member bonded to the substrate to enclose the stack. The element further includes a light-outcoupling structure provided on a side of the substrate facing the first electrode and having an uneven structure made of material having a refractive index almost equal to or lower than a
(Continued)

refractive index of the substrate. The uneven structure includes a plane divided into a matrix of sections, and multiple protruded parts having almost same heights individually allocated to desired sections of the matrix. With regard to an arbitrary region of the plane, a ratio of a total area of one or some of the multiple protruded parts in the arbitrary region to an area of the arbitrary region is almost constant.

16 Claims, 7 Drawing Sheets

(51) Int. Cl.
  *H05B 33/10* (2006.01)
  *H01L 51/00* (2006.01)
  *H01L 51/50* (2006.01)

(52) U.S. Cl.
  CPC ...... *H01L 51/5206* (2013.01); *H01L 51/5221* (2013.01); *H01L 51/5246* (2013.01); *H01L 51/5253* (2013.01); *H01L 51/5259* (2013.01); *H01L 51/5262* (2013.01); *H01L 51/5268* (2013.01); *H05B 33/10* (2013.01); *H01L 2251/558* (2013.01)

(58) Field of Classification Search
  CPC ............. H01L 51/5253; H01L 51/5259; H01L 51/5262; H01L 51/5268; H01L 2251/558; H01L 51/5275; H05B 33/10
  See application file for complete search history.

(56) References Cited

U.S. PATENT DOCUMENTS

| | | |
|---|---|---|
| 8,249,409 B2 | 8/2012 | Zhang et al. |
| 2002/0180348 A1 | 12/2002 | Oda et al. |
| 2003/0116719 A1 | 6/2003 | Miyazawa |
| 2004/0217704 A1 | 11/2004 | Iwase et al. |
| 2004/0241421 A1 | 12/2004 | Ootsuka et al. |
| 2005/0157367 A1 | 7/2005 | Miyazawa |
| 2006/0062270 A1 | 3/2006 | Okutani et al. |
| 2006/0099873 A1 | 5/2006 | Iwase et al. |
| 2008/0093978 A1 | 4/2008 | Mori |
| 2008/0176041 A1 | 7/2008 | Sato et al. |
| 2009/0021678 A1 | 1/2009 | Son et al. |
| 2009/0128022 A1 | 5/2009 | Shim et al. |
| 2010/0046236 A1 | 2/2010 | Nishiwaki |
| 2010/0134572 A1* | 6/2010 | Satoh ................. B41J 13/02 347/85 |
| 2010/0150513 A1* | 6/2010 | Zhang ................. B82Y 20/00 385/131 |
| 2011/0080738 A1 | 4/2011 | Wakabayashi et al. |
| 2011/0200293 A1 | 8/2011 | Zhang et al. |
| 2012/0286258 A1* | 11/2012 | Naraoka ............. C09K 11/06 257/40 |
| 2012/0292652 A1 | 11/2012 | Yamae et al. |
| 2013/0285039 A1* | 10/2013 | Ishihara ............. H01L 51/5265 257/40 |
| 2015/0144900 A1* | 5/2015 | Lee .................... H01L 51/5268 257/40 |

FOREIGN PATENT DOCUMENTS

| | | |
|---|---|---|
| JP | 11-283751 | 10/1999 |
| JP | 2991183 B | 12/1999 |
| JP | 2003-142262 | 5/2003 |
| JP | 2004-281380 | 10/2004 |
| JP | 2005-063838 | 3/2005 |
| JP | 2006-155940 | 6/2006 |
| JP | 2006-294491 | 10/2006 |
| JP | 2007-335253 | 12/2007 |
| JP | 2009-522593 | 6/2009 |
| JP | 2009-217292 | 9/2009 |
| JP | 2010-102965 | 5/2010 |
| JP | 2010-146893 | 7/2010 |
| JP | 2012-079663 | 4/2012 |
| JP | 2012-109255 | 6/2012 |
| JP | 2012-174410 | 9/2012 |
| TW | I232701 B | 5/2005 |
| TW | 201214819 A1 | 4/2012 |
| WO | 03/026357 | 3/2003 |
| WO | 2011/132773 | 10/2011 |

OTHER PUBLICATIONS

U.S. Appl. No. 14/418,560 to Shin Okumura et al., filed Jan. 30, 2015.
Search report from PCT/JP2013/005947, mail date is Dec. 24, 2013.
English translation of Taiwanese Search Report mailed Oct. 14, 2015 with respect to Taiwan Patent Application No. 102136813.
Office Action issued in China family member Patent Appl. No. 201380053234.6, dated May 5, 2016, along with an English translation thereof.

* cited by examiner

ORGANIC ELECTROLUMINESCENCE ELEMENT AND LIGHTING DEVICE

TECHNICAL FIELD

The present invention relates to an organic electroluminescence element and a lighting device including an organic electroluminescence element.

BACKGROUND ART

In a known general structure of an organic electroluminescence element (hereinafter referred to as "organic EL element"), an anode made of a transparent electrode, a hole transport layer, a light emitting layer, an electron injection layer, and a cathode are stacked on a surface of a transparent substrate in this order. It is known that such an organic EL element is used to produce a planar light emitting device (lighting panel). In this organic EL element, light is produced in an organic light emitting layer in response to application of voltage between the anode and the cathode, and the produced light is emitted outside through the transparent electrode and the transparent substrate and goes outside.

The organic EL element gives a self-emission light in various wavelengths, with a relatively high yield. Such organic EL elements are expected to be applied for production of displaying apparatuses (e.g., light emitters used for such as flat panel displays), and light sources (e.g., liquid-crystal displaying backlights and illuminating light sources). Some of organic EL elements have already been developed for practical uses. Recently, in consideration of application and development of organic EL elements to such uses, an organic EL element having high efficiency, prolonged lifetime, and high brightness is expected.

It is considered that the efficiency of the organic EL element is mainly dominated by three of electrical optical conversion efficiency, driving voltage, and light-outcoupling efficiency. With regard to the electrical optical conversion efficiency, it was reported that the organic EL element with the light emitting layer made of phosphorescent light emitting material can have external quantum efficiency greater than 20%. The external quantum efficiency of 20% is considered to be corresponding to internal quantum efficiency of about 100%. It is considered that the organic EL element having the electrical optical conversion efficiency reaching a limiting value has been developed in the experimental stage. In view of the driving voltage, an organic EL element which shows relatively high brightness in receipt of voltage higher by 10 to 20% than voltage corresponding to an energy gap of the light emitting layer has been developed. In other words, improvement of efficiency of the organic EL element resulting from a decrease in voltage is not so effective. Consequently, it is expected that improvement of these two factors is not so effective for an increase in the efficiency of the organic EL element.

Generally, the organic EL element has the light-outcoupling efficiency in the range of about 20 to 30% (this value slightly changes depending on lighting patterns, and/or a layer structure between the anode and the cathode). This light-outcoupling efficiency is not high. This low light-outcoupling efficiency may be explained by the following consideration: materials used for light emitting portion and a vicinity thereof have characteristics such as a high refractive index and light absorption properties, and therefore the total reflection at the interfaces between materials with different refractive indices and absorption of light by materials may occur and this causes inhibition of effective propagation of light to the outside. Such low light-outcoupling efficiency means 70 to 80% of the total amount of produced light does not effectively contribute to light emission. Consequently, it is considered that improvement of the light-outcoupling efficiency causes a great increase in the efficiency of the organic EL element.

In consideration of the above background, there is studied and developed actively to improve the light-outcoupling efficiency. Especially, there have been many efforts to increase the amount of light which is produced in the organic layer and reaches the substrate. For example, the organic layer has the refractive index of about 1.7, and a glass layer generally serving as the substrate has the refractive index of about 1.5. In this case, a loss caused by total reflection at the interface between the organic layer and the glass layer probably reaches about 50% of total amount of radiated light. The value of about 50% is calculated by use of point source approximation in consideration that the emitted light is expressed as an integration of three dimensional radiation of light from organic molecules. Unfortunately, the total reflection at the interface between the organic layer and the substrate tends to cause a great loss. In view of this, it is possible to greatly improve the light-outcoupling efficiency of the organic EL element by decreasing the loss caused by the total reflection between the organic layer and the substrate.

CITATION LIST

Patent Literature

Patent Literature 1: JP 2931211 B
Patent Literature 2: JP 2991183 B
Patent Literature 3: JP 2006-294491 A

SUMMARY OF INVENTION

Technical Problem

Patent Literatures 1 to 3 disclose methods for reducing total reflection loss at the interface between the organic layer and the substrate. Patent Literature 1 discloses techniques of forming a light scattering part made of a lens sheet inside or outside a substrate. Due to the techniques disclosed in this literature, the light scattering part decreases the total reflection loss and therefore the light-outcoupling efficiency can be improved. Patent Literature 2 discloses techniques of using diffraction gratings. The diffraction gratings can change angles of light and thereby change the traveling direction of light. Consequently, the light-outcoupling efficiency can be improved. Patent Literature 3 discloses techniques of interposing a layer of high refractive index material having light scattering properties between a transparent electrode and a substrate. Due to the layer of high refractive index material having light scattering properties, the light-outcoupling efficiency can be improved.

However, generally, with regard to the light-outcoupling structure based on light scattering disclosed in Patent Literature 1 and Patent Literature 3, effects of light traveling inward of scattered light is relatively large, and thus internal absorption is likely to increase. Therefore, it is impossible to improve the light-outcoupling efficiency more than expected. The light scattering structure is generally dominated by a random structure, and therefore control of the light-outcoupling efficiency is difficult. In contrast, in Patent Literature 2, the diffraction grating which is a fine structure having a predetermined shape is used, and it is expected that diffraction effects cause improvement of the light-outcoupling efficiency. However, the improvement of the light-outcoupling efficiency caused by the diffraction effects strongly depends on a wavelength and a direction of light. Therefore, color coordinates of emerging light are likely to vary depending on a view angle (i.e., a color difference becomes large). In short, the view angle dependency is likely to increase. Especially, with regard to organic EL elements for lighting use and in particular organic EL elements with white emission color, it is preferable that the view angle dependency be smaller, and light emission with a low color difference which means that color is not likely to change depending on the view angle is highly required.

In view of the above insufficiency, the objective of the present invention is to propose the organic electroluminescence element and the lighting device which have the improved light-outcoupling efficiency as a result of a decrease in the total reflection loss, and can emit light with a lowered color difference while suppressing the view angle dependency.

Solution to Problem

The organic electroluminescence element according to the present invention includes: a moisture-proof substrate being light transmissive; a light emitting stack including a first electrode being light transmissive, a light emitting layer for emitting at least two rays of light with different emission wavelengths, and a second electrode which are arranged in this order from the moisture-proof substrate; and an enclosing member bonded to the moisture-proof substrate to enclose the light emitting stack. The organic electroluminescence element further includes a light-outcoupling structure which is provided on a side of the moisture-proof substrate facing the first electrode and has an uneven structure made of material having a refractive index almost equal to a refractive index of the moisture-proof substrate or lower than the refractive index of the moisture-proof substrate. The uneven structure includes a plane divided into a matrix of sections to be protruded or recessed, and multiple protruded parts having almost same heights which are individually allocated to desired sections of the matrix so that the multiple protruded parts are arranged in the plane. With regard to an arbitrary region of the plane, a ratio of a total area of one or some of the multiple protruded parts in the arbitrary region to an area of the arbitrary region is almost constant.

In the aforementioned organic electroluminescence element, it is preferable that the light-outcoupling structure have a side face defined as an inclined face which inclines inward from a direction perpendicular to a surface of the moisture-proof substrate.

In the aforementioned organic electroluminescence element, it is preferable that the light-outcoupling structure have a side face including a side uneven structure which is partially protruded and recessed laterally in a plan view of the organic electroluminescence element.

In the aforementioned organic electroluminescence element, it is preferable that an average pitch of protrusions and recesses of the side uneven structure be greater than 0.3 μm and be less than 10 μm.

In the aforementioned organic electroluminescence element, it is preferable that the light-outcoupling structure include a recessed portion which is formed in a surface facing the first electrode to be deeper than a recessed part of the uneven structure and that the first electrode be formed on the surface of the light-outcoupling structure so as to be shaped along an inner face of the recessed portion.

In the aforementioned organic electroluminescence element, it is preferable that the recessed portion penetrate through the light-outcoupling structure.

In the aforementioned organic electroluminescence element, it is preferable that the light-outcoupling structure include a transparent cover layer and that the transparent cover layer be made of material higher in a refractive index than the moisture-proof substrate and covering the uneven structure.

In the aforementioned organic electroluminescence element, it is preferable that the transparent cover layer be made of resin.

In the aforementioned organic electroluminescence element, it is preferable that the light-outcoupling structure be situated to be enclosed by the enclosing member in a plan view.

In the aforementioned organic electroluminescence element, it is preferable that the organic electroluminescence element further include a barrier layer situated between the light-outcoupling structure and the first electrode and that the barrier layer be moisture-proof and light transmissive.

In the aforementioned organic electroluminescence element, it is preferable that the barrier layer have a thickness equal to or less than 400/n [nm], where n represents an average refractive index of the barrier layer.

In the aforementioned organic electroluminescence element, it is preferable that the uneven structure be formed as a diffraction optical structure.

In the aforementioned organic electroluminescence element, it is preferable that the light-outcoupling structure include water absorbing material which is higher in water absorbability than adhesive for bonding the enclosing member to the moisture-proof substrate.

In the aforementioned organic electroluminescence element, it is preferable that the light-outcoupling structure be defined as a first light-outcoupling structure and that a second light-outcoupling structure include a light scattering structure is provided to an opposite surface of the moisture-proof substrate from the first electrode.

In the aforementioned organic electroluminescence element, it is preferable that the second light-outcoupling structure be formed by roughening the moisture-proof substrate.

The lighting device in accordance with the present invention includes the aforementioned organic electroluminescence element.

Advantageous Effects of Invention

According to the present invention, the light-outcoupling structure including the uneven structure is provided, and therefore it is possible to obtain the organic electroluminescence element and the lighting device which have the improved light-outcoupling efficiency as a result of a decrease in the total reflection loss, and can emit light with a reduced color difference while suppressing the view angle dependency.

BRIEF DESCRIPTION OF DRAWINGS

FIG. 2A is a schematic plan thereof and FIG. 2B is a schematic section thereof.

DESCRIPTION OF EMBODIMENTS

Figure 1:
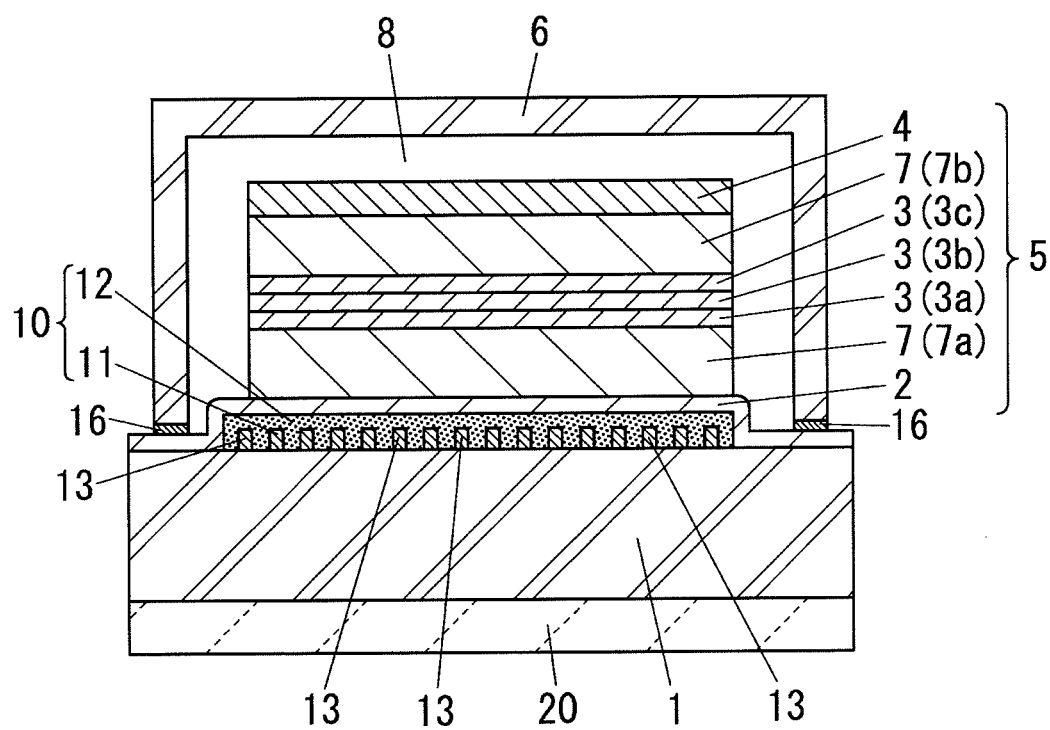
FIG. 1 is a section illustrating an example of the embodiment of the organic electroluminescence element.

FIG. 1 shows an example of an embodiment of the organic electroluminescence element (the organic EL element). This organic EL element includes a moisture-proof substrate 1 being light transmissive; a light emitting stack 5; and an enclosing member 6 enclosing the light emitting stack 5. The light emitting stack 5 includes a first electrode 2 being light transmissive, a light emitting layer 3 for emitting light with at least two different emission wavelengths, and a second electrode 4 which are arranged in this order from the moisture-proof substrate 1. The enclosing member 6 is bonded to the moisture-proof substrate 1. The organic EL element includes a light-outcoupling structure which is provided on a side of the moisture-proof substrate 1 facing the first electrode 2 and has an uneven structure 11 made of material having a refractive index almost equal to a refractive index of the moisture-proof substrate 1 or lower than the refractive index of the moisture-proof substrate 1. This light-outcoupling structure is defined as a first light-outcoupling structure 10. The uneven structure 11 includes a plane divided into a matrix of sections to be protruded or recessed, and multiple protruded parts 13 have almost same heights which are individually allocated to desired sections of the matrix so that the multiple protruded parts are arranged in the plane. With regard to an arbitrary region of the plane, a ratio of a total area of one or some of the multiple protruded parts 13 in the arbitrary region to an area of the arbitrary region is almost constant.

The moisture-proof substrate 1 may be made of a substrate material which is light transmissive and high moisture-proof. Therefore, it is possible to allow light to pass through the moisture-proof substrate 1, and it is possible to prevent intrusion of moisture into an inside of the element through the first electrode 2. For example, when the moisture-proof substrate 1 is made of material such as glass and moisture-proof transparent resin, it is possible to prevent outside moisture from permeating through the moisture-proof substrate 1, and to allow light produced ty the light emitting stack 5 to emerge outside. In view of improvement of moisture-proof properties, the moisture-proof substrate 1 is preferably made of glass. The moisture-proof substrate 1 may have a refractive index of about 1.5, but the refractive index is not limited to this value.

The moisture-proof substrate 1 may be made of soda glass or non-alkali glass. In this implemented embodiment, soda glass is preferable. In a case of using soda glass, soda glass is relatively inexpensive, and production cost can be lowered. Further, in the implemented embodiment, the first light-outcoupling structure 10 which can serve as a foundation layer is present between the moisture-proof substrate 1 and the first electrode 2. Therefore, even when soda glass is used, it is possible to suppress effects of alkali diffusion on the first electrode 2 made of a layer of transparent metal oxide such as ITO.

The light emitting stack 5 is a stack of the first electrode 2, the light emitting layer 3, and the second electrode 4. The light emitting stack 5 is produced by forming the first electrode 2, the light emitting layer 3, and the second electrode 4 on the moisture-proof substrate 1 in this order from the moisture-proof substrate 1. The light emitting stack 5 is provided to a region which is a central region of the moisture-proof substrate 1 in a plan view (when the moisture-proof substrate 1 is viewed in a direction perpendicular to a surface of this substrate). In the organic EL element, the region to which the light emitting stack 5 is provided in a plan view serves as a light emission region.

The first electrode 2 and the second electrode 4 are a pair of electrodes, and one of the pair serves as an anode, and the other serves as a cathode. In the implemented embodiment, the first electrode 2 serves as an anode, and the second electrode 4 serves as a cathode. However, in contrast, the first electrode 2 may serve as a cathode, and the second electrode 4 may serve as an anode. The first electrode 2 is preferably light transmissive. In this case, the first electrode 2 is used as an electrode allowing light to emerge. The first electrode 2 may be made of a transparent conductive layer. Further, the second electrode 4 may be light reflective. In this case, it is possible to reflect light emitted from the light emitting layer 3 toward the second electrode 4 by the second electrode 4 so as to emerge outside from the moisture-proof substrate 1. Alternately, the second electrode 4 may be light transmissive. When the second electrode 4 is light transmissive, it is possible to realize a structure which allows light to emerge outside from a surface of the second electrode 4 close to the enclosing member 6. Alternatively, when the second electrode 4 is light transmissive, a light reflective layer may be formed on an opposite surface of the second electrode 4 from the light emitting layer 3. In this case, light traveling toward the second electrode 4 can be reflected by the light reflective layer and thus emerges outside through the moisture-proof substrate 1.

The first electrode 2 may be formed as an anode. The anode is an electrode for injecting holes into the light emitting layer 3. The anode may be preferably made of an electrode material with a large work function, such as metal, alloys, electrically conductive compounds, and mixtures thereof. Further, to avoid a situation where a difference between a work function of the material of the anode and the HOMO (Highest Occupied Molecular Orbital) level becomes excessively large, the work function of the material of the anode preferably is equal to or more than 4 eV and equal to or less than 6 eV. The electrode material of the anode may be selected from ITO, tin oxide, zinc oxide, IZO, copper iodide, conductive polymer (e.g., PEDOT and polyaniline), conductive polymer doped with arbitrary acceptors, and conductive light transmissive material (e.g., carbon nanotube). In this regard, when the anode is formed as the first electrode 2, the anode can be a thin film formed on a surface of the moisture-proof substrate 1 by sputtering, vacuum deposition, or coating. When the first electrode 2 is formed as a transparent anode, the first electrode 2 may have a refractive index of about 1.8 to 2. However, the refractive index of the first electrode 2 is not limited to this value. To reduce loss caused by total reflection at an interface between an organic layer and a substrate, it is preferable that a difference between refractive indexes of the first electrode 2 and the moisture-proof substrate 1 is smaller. The organic layer may mean a layer which is situated between the first electrode 2 and the second electrode 4 and contains organic material. Note that, a sheet resistance of the anode is preferably equal to or less than several hundreds Ω/□, and more preferably is equal to or less than 100Ω/□. Further, a thickness of the anode may be equal to or less than 500 nm, and may be preferably in a range of 10 nm to 200 nm. In a case where light emerges through the anode, light transmissivity tends to increase with a decrease in the thickness of the anode, but the sheet resistance tends to increase with a decrease in the thickness. When the size of the element is increased, a high voltage may be required, and luminance uniformity may become poor (caused by non-uniformity of a current density distribution resulting from a drop in voltage). To avoid this trade-off, it is effective to form, on the anode, an auxiliary electrode which is made of metal and is in a grid shape. In this case, to prevent such a grid wire from acting as light blocking member, the grid part may be preferably subjected to an insulating treatment to block a current flow to the light emitting layer 3.

When the anode is formed by use of ITO, a film of ITO may be preferably formed at a temperature equal to or more than 150° C. which causes crystallization of ITO. Alternatively, a film of ITO may preferably be formed at a low temperature and then subjected to annealing (heating at a temperature equal to or more than 150° C.). Crystallization causes an increase in conductivity, and therefore the aforementioned trade-off condition may be eased. Owing to crystallization, the structure becomes dense, and therefore effects of suppressing outgas (e.g., water vapor) from resin from reaching the light emitting layer 3 can be expected.

The second electrode 4 can be formed as a cathode. The cathode is an electrode for injecting electrons into the light emitting layer 3. The cathode may be preferably made of an electrode material with a small work function, such as metal, alloys, electrically conductive compounds, and mixtures thereof. Further, to avoid a situation where a difference between a work function of the material of the cathode and the LUMO (Lowest Unoccupied Molecular Orbital) level becomes excessively large, the work function of the material of the cathode preferably is equal to or more than 1.9 eV and equal to or less than 5 eV. The electrode material of the cathode may be selected from aluminum, silver, magnesium, and an alloy of one or more of these metals and other metal (e.g., an amalgam of magnesium and silver, an amalgam of magnesium and indium, and an alloy of aluminum and lithium). Alternatively, the electrode material of the cathode may be selected from conductive material of metal, metal oxide, and a mixture of one or more of these and other metal. For example, the cathode may be a stack film of an ultra-thin film of aluminum oxide (a thin film of a thickness equal to or less than 1 nm which allows flow of electrons due to tunnel injection) and a thin film of aluminum.

The light emitting stack 5 includes at least one light emitting layer 3. The light emitting layer 3 is a layer for causing recombination of holes from the anode (the first electrode 2) and electrons from the cathode (the second electrode 4) to produce light. The light emitting layer 3 may be formed by doping a layer medium for forming the light emitting layer 3 with dopants. The layer medium may be made of electron transport material or hole transport material.

The first electrode 2 and the second electrode 4 are arranged so as not to be in physically contact with each other, and thereby are electrically insulated from each other. The first electrode 2 and the second electrode 4 each include an extended part which is extended to be present outside the enclosing member 6. Alternatively, the first electrode 2 and the second electrode 4 are formed so as to be in contact with parts made of electrode material which extend from an inside to an outside of the enclosing member 6, respectively. To supply power to the first electrode 2 and the second electrode 4, it is necessary to provide parts which are electrically connected to the first electrode 2 and the second electrode 4 and situated outside an enclosed region. However, when the electrode material gives extended parts, power supply to the organic EL element is allowed. FIG. 1 shows an example in which the first electrode 2 includes an extended part extending outside the enclosing member 6.

The light emitting layer 3 of the implemented embodiment emits two or more rays of light having different emission wavelengths. The phrase "the light emitting layer 3 emits two or more rays of light with different emission wavelengths" means that the light emitting layer 3 emits two or more rays of light with different emission wavelengths as a whole. Emission of two or more rays of light can be implemented by a structure in which multiple light emitting layers 3 have different emission wavelengths. Or, a single light emitting layer 3 is designed to emit two or more rays of light. In the implemented embodiment of FIG. 1, multiple light emitting layers 3 are provided. In more detail, three light emitting layers 3 (a first light emitting layer 3a, a second light emitting layer 3b, and a third light emitting layer 3c) are provided. These three light emitting layers 3 have different emission wavelengths. Therefore, three rays of light with different emission wavelengths are emitted from a whole of the light emitting layer 3. By providing multiple light emitting layers 3 as described above, it is possible to produce white light easily. For example, when the multiple light emitting layers 3 include three light emitting layers 3 of a green light emitting layer, a red light emitting layer, and a blue light emitting layer, white light emission can be enabled. For example, a multilayered structure of multiple light emitting layers 3 may be a multilayered structure of a blue hole transport light emitting layer, a green electron transport light emitting layer, and a red electron transport light emitting layer, or a multilayered structure of a blue electron transport light emitting layer, a green electron transport light emitting layer, and a red electron transport light emitting layer. Alternatively, four or more light emitting layers 3 may be stacked. Light emission can be caused by fluorescent emission or phosphorescent emission. Alternatively, both of a fluorescent light emitting layer and a phosphorescent light emitting layer can be used.

The configuration of the light emitting layer 3 is not limited to the configuration shown in FIG. 1. The light emitting layer 3 may have a single layer structure or a multilayer structure. In a case of the single layer structure, use of two or more types of dopants enables formation of the light emitting layer 3 which emits light with different wavelengths. Further, with regard to the single layer structure, when a desired emission color is white, by doping the light emitting layer 3 with three types of dopant pigments of red, green, and blue, white emission can be obtained. Alternately, the white emission can be obtained by use of different two colors. For example, when an orange emission dopant, by selecting an additional dopant appropriately, white emission can be obtained due to emission of two colors. In a case of emission of two colors, it is possible to use a single light emitting layer 3 doped with two types of dopants, or two light emitting layers 3 individually doped with different dopants.

Further, a stack structure which is situated between an anode and cathode and emits light in response to application of voltage between the anode and the cathode may be treated as one light emitting unit. In this case, a multiunit structure may be used. In the multiunit structure, two or more light emitting units are stacked and electrically connected with one or more interlayers in-between. Such interlayers may be light transmissive and electric conductive. The multiunit structure may be a structure in which two or more light emitting units are stacked in a thickness direction between one anode and one cathode.

The light emitting stack 5 preferably includes a charge moving layer 7 as a layer for injection and transport of holes or electrons to the light emitting layer 3. The charge moving layer 7 may be appropriately selected from a hole injection layer, a hole transport layer, an electron transport layer, an electron injection layer, and an interlayer. In the implemented embodiment of FIG. 1, a first charge moving layer 7a is provided on a side of the light emitting layer 3 facing the anode (the first electrode 2). The first charge moving layer 7a may be a hole transport layer, or a stack of a hole injection layer and a hole transport layer. Additionally, a second charge moving layer 7b is provided on a side of the light emitting layer 3 facing the cathode (the second electrode 4). The second charge moving layer 7b may be an electron injection layer, or a stack of an electron transport layer and an electron injection layer. The charge moving layer 7 may be situated between adjacent two of the light emitting layers 3. For example, in the multiunit structure, by forming at least one charge moving layer 7 including an interlayer between adjacent two of multiple light emitting layers 3, multiple light emitting units can be formed. Note that, it may be unnecessary to provide the charge moving layer 7 to the light emitting stack 5 as long as emission is enabled.

For example, the stack structure of the light emitting stack 5 may be an appropriate structure such as a single layer structure of the light emitting layer 3, a stack structure of a hole transport layer, the light emitting layer 3, and an electron transport layer, a stack structure of a hole transport layer and the light emitting layer 3, and a stack structure of the light emitting layer 3 and an electron transport layer. Further, a hole injection layer may be situated between an anode and a hole transport layer.

Examples of a material for the hole injection layer include: a hole injection organic material and metal oxide; and an organic material and inorganic material used as material for acceptor; and a p-doped layer. The hole injection organic material is a material that has hole injection properties, a work function of 5.0 to 6.0 eV, and strong adherence to the anode, and is CuPc, starburst amine, or the like, for example. A hole injection metal oxide is, for example, a metal oxide that includes any of molybdenum, rhenium, tungsten, vanadium, zinc, indium, tin, gallium, titanium, and aluminum. Not only an oxide of a single metal, it may be a composite metal oxide that include any one of sets including a set of indium and tin, a set of indium and zinc, a set of aluminum and gallium, a set of gallium and zinc, and a set of titanium and niobium. The hole injection layers made of these materials may be formed by a dry process such as vapor deposition, a transfer method, or may be formed by a wet process such as spin coating, spray coating, dye coating, or gravure printing.

A material for the hole transport layer can be selected from a group of compounds with hole transportability. Examples of the compounds with hole transportability include arylamine compounds (e.g., 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4"-tris(N-(3-methylphenyl)N-phenylamino)triphenylamine (MTDATA), 4,4'-N,N'-dicarbazolebiphenyl (CBP), spiro-NPD, spiro-TPD, spiro-TAD, and TNB), an amine compound that contains a carbazole group, and an amine compound that contains a fluorene derivative. However, an arbitrary hole transport material that is generally known is available. For example, the material for the hole transport layer may be selected from TPD, NPD, TPAC, and DTASi.

As a material for the electron transport layer can be selected from a group of compounds with electron transportability. Examples of the compounds with an electron transportability include a metal complex that is known as an electron transportable material (e.g., Alq3), and a heterocyclic compound (e.g., a phenanthroline derivative, a pyridine derivative, a tetrazine derivative, and an oxadiazole derivative). However, an arbitrary electron transport material that is generally known can be used. For example, the material for the hole transport layer may be selected from TPD, NPD, TPAC, and DTASi. For example, the material for the electron transport layer may be selected from BCP, TAZ, BAlq, $Alq_3$, OXD7, and PBD.

A material for the electron injection layer is arbitrarily selected from the following examples. Examples of the material for the electron injection layer include: metal halides such as a metal fluoride (e.g., lithium fluoride and magnesium fluoride) and metal chloride (e.g., sodium chloride and magnesium chloride); and metal oxide; and metal nitride; and metal carbide; and metal oxynitride; and a carbon compound; and a silicon compound (e.g., $SiO_2$ and SiO). Examples of metal for the metal oxide, the metal carbide, and the metal oxynitride include aluminum, cobalt, zirconium, titanium, vanadium, niobium, chromium, tantalum, tungsten, manganese, molybdenum, ruthenium, iron, nickel, copper, gallium, zinc, and silicon. More specific examples of the metal oxide, the metal carbide, and the metal oxynitride include a compound to serve as insulators such as aluminum oxide, magnesium oxide, iron oxide, aluminum nitride, silicon nitride, silicon carbide, silicon oxynitride, and boron nitride. Alternatively, as well as aforementioned examples including fluoride, oxide, and carbonate of alkali metal and alkali-earth metal (e.g., LiF, $Li_2O$, MgO, and $Li_2CO_3$), alkali metal or alkali-earth metal such as lithium, sodium, cesium, and calcium may be used alone. Alternatively, a layer formed by doping an organic layer with donor type organic materials or aforementioned metal materials, which is so-called an n-doped layer, may be available. These materials can be formed into a thin film by vacuum vapor deposition, sputtering, or coating.

The enclosing member 6 is bonded to a surface of the moisture-proof substrate 1 facing the light emitting stack 5 so as to house and enclose the light emitting stack 5. The light emitting stack 5 is covered with the enclosing member 6 bonded to the moisture-proof substrate 1, and thereby is enclosed. The light emitting stack 5 is enclosed and protected by the enclosing member 6, and therefore physical impact on the light emitting stack 5 can be reduced, and intrusion of moisture can be suppressed. Consequently, deterioration of the light emitting stack 5 can be suppressed. The enclosing member 6 encloses the light emitting stack 5 to protect the same, and may be made of appropriate material. In the implemented embodiment, the enclosing member 6 is formed by use of an enclosing substrate made of a glass substrate.

The enclosing member 6 may be made of low moisture permeable substrate material. The enclosing member 6 may be a glass substrate, for example. When the enclosing member 6 is the glass substrate, moisture intrusion can be prevented. Alternatively, the enclosing member 6 may be an enclosing substrate including an accommodation recess for accommodating the light emitting stack 5. Such an enclosing substrate is so-called a cap-shaped enclosing substrate. When the enclosing member 6 is the enclosing substrate including the accommodation recess, the light emitting stack 5 can be enclosed well hermetically.

The enclosing member 6 is bonded to the moisture-proof substrate 1 with adhesive. The adhesive may be resin adhesive, for example. The resin adhesive may be preferably moisture-proof. For example, to improve moisture-proof properties, desiccant can be contained in the resin adhesive. The resin adhesive includes a main component such as thermosetting resin or ultraviolet curable resin. By curing the adhesive, a hermetically-bonding member 16 is formed.

The enclosing member 6 may be bonded to the moisture-proof substrate 1 by the hermetically-bonding member 16 at a region surrounding a periphery of the light emitting stack 5. Consequently, an entire periphery of the enclosing substrate is bonded to the moisture-proof substrate 1, and the light emitting stack 5 can be enclosed well hermetically, and isolated from the outside. The hermetically-bonding member 16 may be formed into a frame shape. As a result of enclosing of the light emitting stack 5, an enclosed gap 8 may be present inside a space of the accommodation recess. In the organic EL element, the enclosed gap 8 may be filled with filler to give a filling and enclosing structure, or the enclosed gap 8 may be left as an enclosing space to give a hollow structure. When the enclosed gap 8 is left as the enclosing space, desiccant may be provided inside the enclosing space. In this case, even if moisture intrudes into the enclosing space, the intruded moisture can be absorbed. Further, when the enclosed gap 8 is filled with filler, the filler may contain desiccant. In this case, even if moisture intrudes into an inside of the element, the intruded moisture can be absorbed.

Further, the enclosing member 6 may be provided by bonding a flat enclosing substrate with a flat surface to an enclosing wall provided so as to enclose the periphery of the light emitting stack 5. The enclosing wall may be made of the hermetically-bonding member 16. When the enclosing substrate has a flat surface, there is no need to provide a recess for enclosing the light emitting stack 5, and therefore enclosing can be facilitated. The enclosing wall may be made of glass or moisture-proof enclosing resin. When the enclosing wall has a height greater than a thickness of the light emitting stack 5, it is possible to ensure a space with a height greater than the thickness of the light emitting stack 5, and therefore enclosing can be done by use of the flat enclosing substrate. Also in this case, the enclosed gap 8 may be filled with filler to give a filling and enclosing structure. In this regard, the enclosing wall serves as a so-called dam layer for preventing filler from flowing out.

The enclosing member 6 may be provided by bonding a glass cap to a surface of the moisture-proof substrate 1 inside a dew-point controlled glove box (e.g., a dew point is kept equal to or less than −70° C. (dp)). The light emitting stack 5 is weak in water or gas. However, when the light emitting stack 5 is enclosed, it is possible to more avoid contact of the light emitting stack 5 and air. In this regard, when desiccant or hygroscopic material is included inside as mentioned above, preservation lifetime can be prolonged.

The organic EL element of the implemented embodiment includes a light-outcoupling structure which is provided on a side of the moisture-proof substrate 1 facing the first electrode 2 and has an uneven structure 11 made of material having a refractive index almost equal to a refractive index of the moisture-proof substrate 1 or lower than the refractive index of the moisture-proof substrate 1. This light-outcoupling structure is defined as the first light-outcoupling structure 10. The first light-outcoupling structure 10 is provided between the moisture-proof substrate 1 and the first electrode 2. The first light-outcoupling structure 10 is preferably provided on a surface of the moisture-proof substrate 1 facing the first electrode 2. As a result, the first light-outcoupling structure 10 is provided to one surface (surface facing the light emitting stack 5) of the moisture-proof substrate 1 as a light-outcoupling structure. The moisture-proof substrate 1 may be in direct contact with the first light-outcoupling structure 10. The first light-outcoupling structure 10 is formed so as to include the uneven structure 11 provided on the surface of the moisture-proof substrate 1 facing the first electrode 2. This uneven structure 11 is made of material having a refractive index almost equal to the refractive index of the moisture-proof substrate 1 or less than the refractive index of the moisture-proof substrate 1. When the first light-outcoupling structure 10 including the uneven structure 11 is provided as described above, total reflection loss can be reduced and thus a light-outcoupling efficiency can be improved, and further a view angle dependency can be suppressed and thus light emission can be obtained while a color difference is reduced. In other words, total reflection loss between the first electrode 2 and the moisture-proof substrate 1 can be reduced by the uneven structure 11 of the first light-outcoupling structure 10, and therefore an amount of light emerging outside from the moisture-proof substrate 1 can be more increased. In this regard, when the uneven structure 11 is used for extracting light, light is scattered by the uneven structure 11. In contrast to a case where the uneven structure 11 is not provided, it is possible to decrease a difference (color difference) between a color in a perpendicular direction to the substrate and a color in a diagonal direction to the substrate. Consequently, the view angle dependency can be suppressed and thus light emission can be obtained while a color difference is reduced.

In the implemented embodiment, it is preferable that a second light-outcoupling structure 20 including a light scattering structure be provided to an opposite surface of the moisture-proof substrate 1 from the first electrode 2. A light-outcoupling structure provided to the opposite surface of the moisture-proof substrate 1 from the first electrode 2 is defined as the second light-outcoupling structure 20. In FIG. 1, the second light-outcoupling structure 20 is provided to the surface (light emission side surface) on the opposite side of the moisture-proof substrate 1 from the surface to which the first light-outcoupling structure 10 is provided. The second light-outcoupling structure 20 is provided to the surface on the opposite side of the moisture-proof substrate 1 from the first electrode 2, and is formed to have a light scattering structure. When the second light-outcoupling structure 20 is provided as described above, total reflection loss can be reduced and thus a light-outcoupling efficiency can be improved, and further a view angle dependency can be suppressed and thus light emission can be obtained while a color difference is reduced. In this regard, when the uneven structure 11 is used to extract light having different emission wavelengths, color coordinates are likely to change depending on angles from a light emitting surface due to differences between emission wavelengths. In some cases, it may be impossible to sufficiently reduce a difference (color difference) between a color in a perpendicular direction to the substrate and a color in a diagonal direction to the substrate. In particular, in the organic EL element including the light emitting layer 3 emitting various types of light with different emission wavelengths as with the implemented embodiment, a difference in chromaticity may tend to increase, and a so-called view angle dependency problem may occur. However, in a case where the second light-outcoupling structure 20 which is a structure including a light scattering structure is provided to the surface of the moisture-proof substrate 1 directed outward, even when light emission has different wavelengths, a color change (color difference) caused by a difference between light emitting directions can be suppressed by light scattering. Therefore, the view angle dependency can be more suppressed, and therefore light emission can be obtained while a color difference is reduced. Further, the second light-outcoupling structure 20 can scatter light at an exit surface, and therefore a reflection loss at an interface with atmosphere can be reduced and the light-outcoupling efficiency can be improved. Further, these two light-outcoupling structures can suppress glare while light is not emitted, and therefore the appearance (visual quality) can be improved.

Note that, the organic EL element may not include the second light-outcoupling structure 20 but may include only the first light-outcoupling structure 10 as the light-outcoupling structure on the surface of the moisture-proof substrate 1. Also in this case, the light-outcoupling structure (the first light-outcoupling structure 10) including the uneven structure 11 is present, and therefore the total reflection loss can be reduced and thus the light-outcoupling efficiency can be improved, and further the view angle dependency can be suppressed and thus the light emission can be obtained while the color difference is reduced. However, providing the light-outcoupling structures (the first light-outcoupling structure 10 and the second light-outcoupling structure 20) on the opposite surfaces of the moisture-proof substrate 1 is more advantageous.

In the organic EL element, it is preferable that the first light-outcoupling structure 10 be formed into a layer. In this case, it is sufficient that a whole of the first light-outcoupling structure 10 is formed into a layer. In a case where the first light-outcoupling structure 10 is formed into a layer, a region of the moisture-proof substrate 1 on which at least the light emitting stack 5 is to be provided is covered with the first light-outcoupling structure 10. In a case of providing a transparent cover layer 12, the transparent cover layer 12 has a layer shape, and therefore a whole of the first light-outcoupling structure 10 has a layer shape despite whether the uneven structure 11 is formed into a layer. Even when the transparent cover layer 12 is not provided, the uneven structure 11 is formed into a layer as an uneven layer, the first light-outcoupling structure 10 constituted by the uneven structure 11 (uneven layer) has a layer shape as a whole.

The uneven structure 11 is made of material having a refractive index almost equal to a refractive index of the moisture-proof substrate 1 or lower than the refractive index of the moisture-proof substrate 1. The uneven structure 11 may be formed as a layer (uneven layer) including protrusions and recesses. In this sense, the uneven layer is made of material having a refractive index almost equal to a refractive index of the moisture-proof substrate 1 or lower than the refractive index of the moisture-proof substrate 1. FIG. 1 shows the protruded parts 13 constituting the uneven structure 11 as if the protruded parts 13 are separated. Note that, the protruded parts 13 may be separated, or may be connected through material of the uneven layer spreading on the moisture-proof substrate 1. In this regard, the phrase "the material having the refractive index almost equal to a refractive index of the moisture-proof substrate 1" means that an absolute value of a difference between the refractive index of the material and the refractive index of the moisture-proof substrate 1 is equal to or less than 0.1. In a preferable embodiment, the uneven structure 11 is made of the material having the refractive index almost equal to the refractive index of the moisture-proof substrate 1. In this embodiment, a difference between the refractive indices is decreased and therefore a larger amount of light can emerge outside. In a preferable embodiment, the uneven structure 11 is made of the material having the refractive index equal to or less than the refractive index of the moisture-proof substrate 1. In this embodiment, total reflection can be suppressed and therefore a larger amount of light can emerge outside. In a preferable embodiment, the uneven structure 11 is made of the material having the refractive index less than the refractive index of the moisture-proof substrate 1. In this embodiment, total reflection can be more suppressed and therefore a larger amount of light can emerge outside. For example, the refractive index of the uneven structure 11 may be less than the refractive index of the moisture-proof substrate 1 by 0.1 or more, but is not limited to this value.

The uneven structure 11 of the first light-outcoupling structure 10 in the implemented embodiment includes a plane divided into a matrix of sections to be protruded or recessed, and the multiple protruded parts 13 having almost same heights which are individually allocated to desired sections of the matrix so that the multiple protruded parts 13 are arranged in the plane. Further, the uneven structure 11 is formed so that, with regard to an arbitrary region of the plane, a ratio of a total area of one or some of the multiple protruded parts 13 in the arbitrary region to an area of the arbitrary region is almost constant. By providing such an uneven structure 11, the light-outcoupling efficiency can be improved efficiently.

Figure 2A:
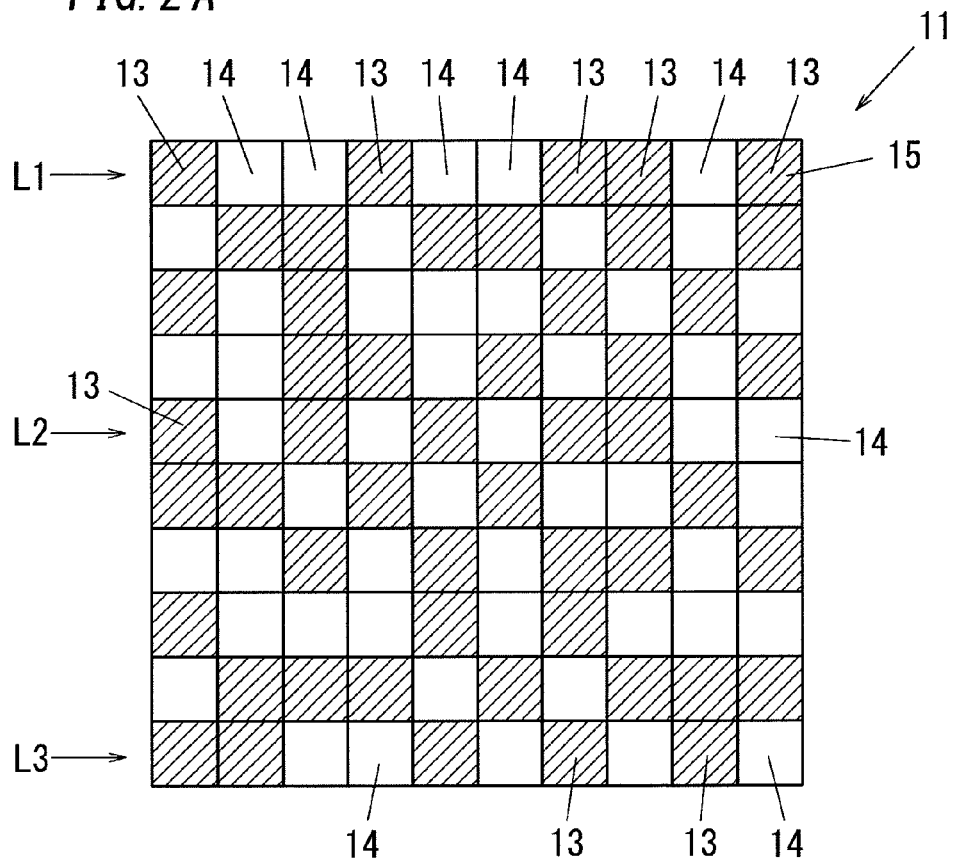
FIG. 2A and FIG. 2B show an example of pattern of the uneven structure.
Figure 2B:
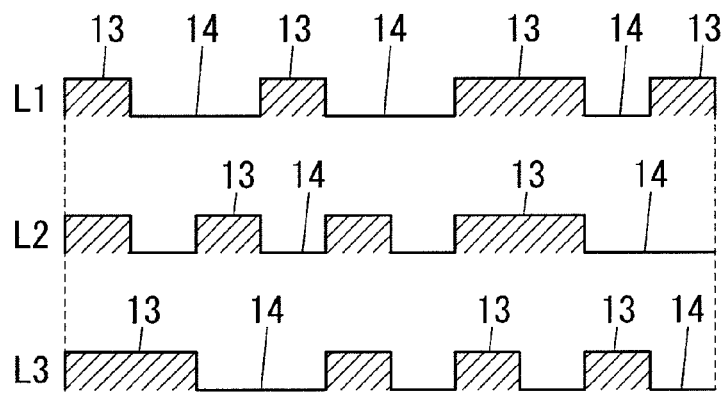

FIG. 2 shows an example of the uneven structure 11. FIG. 2A shows a view in a direction perpendicular to the surface of the moisture-proof substrate 1, and FIG. 2B shows a view in a direction parallel to the surface of the moisture-proof substrate 1. In FIG. 2A, the sections where the protruded parts 13 are provided are illustrated with hatching. Structures indicated by lines L1, L2, and L3 in FIG. 2A correspond to structures indicated by lines L1, L2, and L3 in FIG. 2B, respectively.

As shown in FIG. 2A, the uneven structure 11 is constituted by arrangement of the protruded parts 13 allocated to desired uneven sections of a matrix of uneven sections 15 which are multiple squares (rows and columns) arranged in length and width directions. The uneven sections 15 have the same area. Either one protruded part 13 or one recessed part 14 is allocated to one section (one uneven section 15) to be recessed or protruded. The protruded parts 13 may be allocated regularly or randomly. In the implemented embodiment of FIG. 2, the protruded parts 13 are allocated randomly. As shown in FIG. 2B, in the section to which the protruded part 13 is allocated, the protruded part 13 is formed by making part of the uneven structure 11 protrude toward the first electrode 2. Further, the multiple protruded parts 13 have almost the same heights. In this regard, for example, the phrase "the protruded parts 13 have almost same heights" means that differences between the heights of the multiple protruded parts 13 and an average of the heights of the multiple protruded parts 13 are within a range of ±10% of the average, and preferably are within a range of ±5% of the average.

In FIG. 2B, a section of the protruded part 13 has a rectangular shape, but may have an appropriate shape such as a corrugated shape, an inverted-triangle shape, and a trapezoidal shape. When two protruded parts 13 are adjacent to each other, these protruded parts 13 are connected integrally to form a larger protruded part 13. When two recessed parts 14 are adjacent to each other, these recessed parts 14 are connected integrally to form a larger recessed part 14. The connection number of protruded parts 13 and the connection number of recessed parts 14 are not limited particularly. However, as the connection numbers increase, the uneven structure 11 tends to not have fine structures. For example, the connection numbers may be appropriately set to be equal to or less than 100, 50, 20, or 10.

The uneven structure 11 is formed so that with regard to an arbitrary region of the plane, a ratio of a total area of one or some of the multiple protruded parts 13 in the arbitrary region to an area of the arbitrary region is almost constant. For example, FIG. 2A shows a total number of one-hundred of uneven sections 15 arranged in a 10 by 10 matrix manner. A region constituted by these one-hundred sections is used as a unit region. In the plane of the uneven structure 11, the area ratios of protruded parts 13 are same with regard to unit regions. For example, as shown in FIG. 2A, when the fifty protruded parts 13 are provided to a unit region, other about fifty (e.g., forty-five to fifty-five or forty-eight to fifty-two) protruded parts 13 may be provided to another region which is same in the number of sections to be recessed and protruded and the area as the unit region. The unit region is not limited to a region corresponding to one-hundred sections, but may be a region having a size corresponding to an appropriate number of sections. For example, the number of sections may be 1000, 10000, 1000000, or more. The area ratio of protruded parts 13 slightly varies depending on how to define the region. However, in the implemented embodiment, the area ratios are set to be almost same. For example, a difference between each of upper and lower limits of the area ratio and an average of the area ratio is preferably equal to or less than 10% of the average, and more preferably equal to or less than 5% of the average, and more preferably equal to or less than 3% of the average, and more preferably equal to or less than 1% of the average. As the area ratio becomes more equal to each other, the light-outcoupling efficiency can be more uniformed in the plane and more improved. The area ratio of protruded parts 13 in the unit region is not limited particularly, but may be in a range of 20 to 80%, and preferably in a range of 30 to 70%, and more preferably in a range of 40 to 60%.

In a preferable embodiment, the protruded parts 13 are arranged in a random allocation manner in each unit region. In this embodiment, it is possible to allow a large amount of light to emerge without causing angle dependency.

The uneven structure 11 preferably includes fine recesses and protrusions. Thus, the light-outcoupling efficiency can be more improved. For example, when each section to be recessed or protruded is formed as a square with a side in a range of 0.1 to 100 µm, it is possible to form a fine uneven structure. A side of a square defining one section to be recessed or protruded may be in a range of 0.5 to 10 µm. For example, when the side of the square is 1 µm, it is possible to form the fine uneven structure 11 precisely. Further, the unit region may be a region in a shape of 1 mm square or 10 mm square. Note that, in FIG. 1 and FIG. 2, material forming the uneven structure 11 is not present in the recessed part 14, but material forming the uneven structure 11 may be present in the recessed part 14. In this case, the uneven structure 11 becomes a continuous layer in a whole plane, and becomes thicker at the protruded parts 13 but thinner at the recessed parts 14. In this case, in short, the uneven structure 11 serves as an uneven layer.

The heights of the protruded parts 13 are not limited particularly, but may be in a range of 0.1 to 100 µm, for example. Thus, it is possible to produce the uneven structure 11 with the high light-outcoupling efficiency. For example, when the heights of the protruded parts 13 are set to be in a range of 1 to 10 µm, it is possible to form fine recesses and protrusions precisely.

The multiple protruded parts 13 constituting the uneven structure 11 may have the same shape. In FIG. 2A, the protruded part 13 is provided to cover the entire uneven section 15, and thus the protruded part 13 has a quadrangle (rectangular or square) shape in a plan view. The planar shape of the protruded part 13 is not limited to this example, but may be another shape such as a circular shape and a polygonal shape (e.g., a triangular shape, a pentagonal shape, a hexagonal shape, and an octagon shape). In these cases, a three-dimensional shape of the protruded part 13 may be an appropriate shape such as a cylindrical shape, a prism shape, (e.g., a triangular prism shape and a rectangular prism shape), and a pyramid shape (e.g., a triangle-based pyramid, and a rectangle-based pyramid).

The uneven structure 11 may be made of transparent material. The uneven structure 11 may be made of transparent resin (e.g., acrylic resin and epoxy resin), or inorganic material such as spin-on glass. The uneven structure 11 is made of material having a refractive index lower than the refractive index of the moisture-proof substrate 1. For example, when the moisture-proof substrate 1 is made of glass, the uneven structure 11 is made of material having a refractive index lower than the refractive index of this glass. Thus, it is possible to suppress a decrease in the light-outcoupling efficiency caused by total reflection of light traveling from the transparent uneven structure 11 to the glass substrate. Further, it is preferable that the transparent material of the uneven structure 11 have higher transmissivity. Preferably, an extinction coefficient k of the transparent material is equal to zero with regard to the entire visible wavelength region. The allowable range of the extinction coefficient may be set in accordance with a thickness of a layer made of this material. The material of the uneven structure 11 may be provided to the surface of the moisture-proof substrate 1 by applying. The applying method of this material may be appropriate coating such as spin coating, slit coating, bar coating, spray coating, and inkjetting, which may be selected in accordance with usage or a substrate size.

Protrusions and recesses can be provided to the uneven structure 11 by an appropriate method. For example, particles such as beads are mixed in the transparent material, and thereby protrusions and recesses can be given by shapes of the particles. Further, it is preferable that protrusions and recesses of the uneven structure 11 be formed by imprint lithography. By using the imprint lithography, it is possible to form fine protrusions and recesses efficiently and precisely. Further, as shown in FIG. 2, in case of forming protrusions and recesses by allocating the protruded part 13 or the recessed part 14 to each uneven section 15, it is possible to form fine protrusions and recesses highly precisely by use of the imprint lithography. In a case of forming protrusions and recesses by the imprint lithography, one uneven section 15 may be formed by one dot of printing. It is preferable to use the imprinting lithography allowing formation of fine structures, and for example, so-called nanoimprint lithography is preferable.

The imprint lithography is divided into major categories which are UV imprint lithography and thermal imprint lithography, and either the UV imprint lithography or the thermal imprint lithography is available. In the implemented embodiment, for example, the UV imprint lithography is used. By the UV imprint lithography, it is possible to easily print (transfer) recesses and protrusions to form the uneven structure 11. In the UV imprint lithography, for example, a film mold which is formed by impressing of a Ni master mold patterned to have a rectangular (pillar) structure of 2 µm in period and 1 µm in height is used. UV curable imprint transparent resin is applied onto a substrate, and the mold is pressed against a surface of a resin layer on this substrate. Thereafter, to cure the resin, the resin is irradiated with UV light (e.g., i-line with wavelength $\lambda$=365 nm) which passes through the substrate or the film mold. After the resin is cured, the mold is removed. In this process, it is preferable that the mold be preliminarily subjected to treatment for facilitating removal (e.g., fluorine coating treatment). Thus, it is possible to easily remove the mold from the substrate. Therefore, the recesses and protrusions structure on the mold can be transferred to the substrate. Note that, this mold includes recesses and protrusions corresponding to the shape of the uneven structure 11 as shown in FIG. 2. When the recesses and protrusions structure of the mold is transferred, the desired recesses and protrusions structure is provided to the surface of the moisture-proof substrate 1. For example, when the mold in which the recessed parts 14 are randomly allocated to desired sections is used, it is possible to obtain the uneven structure 11 in which the protruded parts 13 are randomly allocated.

In a preferable embodiment, the uneven structure 11 is formed as a diffraction optical structure. In this regard, it is preferable that the protruded parts 13 be provided to show some degree of regularity to give a diffraction optical structure. In the diffraction optical structure, it is preferable that the protruded parts 13 be formed periodically. When the first light-outcoupling structure 10 includes the diffraction optical structure, the light-outcoupling efficiency can be improved. Further, in the implemented embodiment, when the first light-outcoupling structure 10 has a diffraction structure, the second light-outcoupling structure 20 can scatter light, and therefore effects of the view angle dependency can be reduced.

In the diffraction optical structure, it is preferable that a period P of two-dimensional uneven structure 11 (average period of the uneven structure 11 in a case where the uneven structure 11 is not a periodic structure) be appropriately set to be in a range of $\frac{1}{4}\lambda$ to $100\lambda$ wherein $\lambda$ is a wavelength in a medium (which is obtained by dividing a wavelength in vacuum by a refractive index of a medium). This range may be used in a case where a wavelength of light emitted from the light emitting layer 3 is in a range of 300 to 800 nm. When the period P is in the range of $5\lambda$ to $100\lambda$, a geometrical optics effect (enlargement of an area of the surface which light strikes at an angle less than the total reflection angle) causes an increase in the light-outcoupling efficiency. When the period P is in the range of $\lambda$ to $5\lambda$, light striking the surface at an angle not less than the total reflection angle can be emitted outside as diffraction light. Consequently, the light-outcoupling efficiency is improved. When the period P is in the range of $\lambda/4$ to $\lambda$, an effective refractive index at a portion around the uneven structure is decreased with an increase in distance between the portion and the moisture-proof substrate 1. This is equivalent to interposing, between the substrate and a layer of covering protrusions and recesses or the anode, a thin layer having a refractive index between the refractive index of the medium of the uneven structure and the refractive index of the covering layer of the anode. Consequently, it is possible to suppress the Fresnel reflection. In brief, with selecting the period P from the range of $\lambda/4$ to $100\lambda$, it is possible to suppress the reflection (total reflection and/or Fresnel reflection), and therefore improve the light-outcoupling efficiency. In the above range, it is effective to select the period P from the range of $\lambda$ to $5\lambda$ (the range in which a diffraction effect is easily obtained). When the period P is smaller than $\lambda$, only the effects of suppressing Fresnel loss can be expected, and therefore the light-outcoupling efficiency is likely to decrease. In contrast, when the period P exceeds $5\lambda$, it is required to increase heights of recesses and protrusions accordingly (to ensure a phase difference), and therefore flattening by the cover layer is likely to becomes difficult. It is considered to use the cover layer having a very large thickness (e.g., 10 µm or more). However, in this case, there are bad effects such as a decrease in transmissivity, an increase in material cost, and an increase in outgas in a case of resin material. Therefore, to thicken the cover layer may be disadvantageous. In view of this, it is preferable to set the period P as described above. For example, the diffraction structure which has an average pitch of 1 µm (about $3\lambda$ when an average emission wavelength of a white element is 550 nm and a refractive index of resin used for a cover layer is 1.7) and has a height of 0.5 µm can be used for the uneven structure 11. In this case, it is confirmed that the light-outcoupling efficiency which is about 1.5 times as high as that in an element devoid of the uneven structure 11 is obtained.

In the implemented embodiment, the first light-outcoupling structure 10 includes the transparent cover layer 12 covering the uneven structure 11. As described above, when the transparent cover layer 12 is provided, the uneven structure 11 is covered with a layer having a flat surface, and therefore it is possible to provide the light emitting stack 5 successfully. Consequently, disconnection and short-circuiting caused by recesses and protrusions can be suppressed. Further, in a case where the transparent cover layer 12 is provided, even when the uneven structure 11 which is relatively tall (deep) is provided, it is possible to form the light emitting stack 5 finely. As described above, the transparent cover layer 12 can serve as a flattening layer, and therefore it is preferable to provide the transparent cover layer 12. Further, the transparent cover layer 12 is transparent and thus light transmissive, and as a result light can emerge effectively.

The transparent cover layer 12 is preferably made of material having a refractive index higher than the refractive index of the moisture-proof substrate 1. In this case, a difference between the refractive indices can be reduced, and therefore the light-outcoupling efficiency can be more improved. In this regard, it is important to select the refractive index of the transparent cover layer 12. The refractive index of the transparent cover layer 12 is set to be higher than at least the refractive index of the moisture-proof substrate 1, and is more preferably set to a refractive index equivalent to the refractive index of the organic layer (organic light emitting layer) which is, for example, 1.7 or more. In this case, the difference between the refractive indices can be more reduced. The organic light emitting layer may be the light emitting layer 3. Additionally, it is preferable to reduce a difference between the refractive index of the transparent cover layer 12 and a refractive index of the first electrode 2 which is a layer adjacent to the transparent cover layer 12. For example, when the difference between the refractive indices of the first electrode 2 and the transparent cover layer 12 is equal to or less than 1, the difference between the refractive indices can be reduced, and therefore the light-outcoupling efficiency can be improved.

It is preferable that the transparent cover layer 12 be made of resin. In this case, the refractive index can be easily adjusted and flattening of recesses and protrusions can be facilitated. By use of resin material, it is possible to easily obtain the transparent cover layer 12 having a relatively high refractive index. Further, a layer of resin can be made by application, and therefore it is possible to easily form a layer with a flat surface by pouring resin into the recessed part 14.

The transparent cover layer 12 may be made of resin into which high refractive nanoparticles such as $TiO_2$ are dispersed. The resin may be organic resin such as acrylic resin and epoxy resin. Additionally, additive for curing the resin (e.g., curing agent, curing accelerator, and curing initiator) may be added to the resin. Note that, an extinction coefficient k of the material of the transparent cover layer 12 is preferably small as possible, and is more preferably is equal to zero (or a value which is too small to measure) ideally. Note that, the material other than the resin may include an inorganic film made of SiN and a film of inorganic oxide (e.g., $SiO_2$).

The surface provided by the transparent cover layer 12 (surface of the transparent cover layer 12 facing the first electrode 2) is preferably flat. In this case, short-circuit and failure in stacking caused by recesses and protrusions can be suppressed, and it is possible to provide the light emitting stack 5 successfully.

Note that, if the light emission performance or the like is not influenced irrespective of presence of the transparent cover layer 12, there may be no need to provide the transparent cover layer 12. When the transparent cover layer 12 is not provided, the number of layers can be reduced, and therefore the element can be produced more easily. For example, if the height of the protruded part 13 is set to a height to an extent that formation of upper layers is not influenced, the transparent cover layer 12 may not be provided. Even when the transparent cover layer 12 is not provided, the light-outcoupling efficiency can be improved by the first light-outcoupling structure 10 constituted by the uneven structure 11. However, to suppress short-circuit and disconnection, it is preferable to form the transparent cover layer 12 as described above.

In the implemented embodiment of FIG. 1, the first light-outcoupling structure 10 is situated to be enclosed by the enclosing member 6 in a plan view. In other words, the first light-outcoupling structure 10 (the uneven structure 11 and the transparent cover layer 12) is placed in an enclosed space enclosed by the enclosing member 6. The first light-outcoupling structure 10 is smaller in size than a bottom surface of the enclosing member 6, and the first light-outcoupling structure 10 (the uneven structure 11 and the transparent cover layer 12) is not formed at a place to be bonded to the enclosing member 6. As described above, the first light-outcoupling structure 10 is situated inside the enclosing member 6, and therefore intrusion of moisture can be suppressed and it is possible to produce the organic EL element which is prevented from deteriorating due to moisture and is highly reliable. The resin is easily permeable to air (moisture and oxygen). When a resin layer is used as a film for forming recesses and protrusions or covering recesses and protrusions and is in direct contact with atmosphere, the light emitting stack 5 (the light emitting layer 3) may be damaged by air permeating through the resin layer. However, in the implemented embodiment of FIG. 1, the resin layer for forming the first light-outcoupling structure 10 is provided inside the enclosing member 6, and is not exposed outside. Hence, it is possible to prevent moisture and oxygen from permeating through the resin layer.

As the method of forming the first light-outcoupling structure 10 so as to be smaller than the enclosing member 6, a method of forming the resin layer by patterning can be used. For example, as one example of patterning, in a case where the uneven structure 11 and the transparent cover layer 12 are made of UV curable resin, the patterning can be done by curing desired part of resin and removing undesired part of the resin with an organic solvent or the like. By use of such UV curable resin, the patterning can be done easily. Alternatively, the patterning method may include patterning application by inkjetting or masking. In a case of thermosetting resin, patterning can be easily done by partial application.

Further, in the uneven structure 11, for example, when the ultraviolet curable resin is used, recesses and protrusions are formed by use of the mold, and desired part (present inside the enclosing member 6) is cured with ultraviolet rays, and then undesired part is washed away with a solvent. Thereby, the formation of recesses and protrusions and patterning of the flat shape can be done at the same time. Note that, as a method of curing resin used for the uneven structure 11 or the transparent cover layer 12, ultraviolet curing is used. However, thermosetting resin can be used. In this case, the resin can be cured by heating.

It is preferable that the first light-outcoupling structure 10 include water absorbing material which is higher in water absorbability than adhesive for bonding the enclosing member 6 to the moisture-proof substrate 1. In the implemented embodiment, the first light-outcoupling structure 10 serving as an optical member is designed to have water absorbability. Thus, moisture intruded through the adhesive (the hermetically-bonding member 16) can be absorbed by the water absorbing material contained in the optical member, and thereby deterioration of the organic layer can be suppressed, and the reliability can be improved. It is sufficient that the water absorbing material is contained in any part of the first light-outcoupling structure 10. In a preferable embodiment, the water absorbing material is contained in the uneven structure 11 (uneven layer). In another preferable embodiment, the water absorbing material is contained in the transparent cover layer 12. In another preferable embodiment, the water absorbing material is contained in each of the uneven structure 11 and the transparent cover layer 12. In brief, it is sufficient that the water absorbing material is contained in the first light-outcoupling structure 10, and in other words contained in at least one of the uneven structure 11 and the transparent cover layer 12.

FIG. 1 shows a section at a position where the first light-outcoupling structure 10 is covered with the first electrode 2. However, with regard to the enclosed inside, the first light-outcoupling structure 10 may include part which is not covered with the first electrode 2. Therefore, moisture intruding through the hermetically-bonding member 16 can be absorbed by the water absorbing material contained in the first light-outcoupling structure 10.

An example of the water absorbing material contained in the first light-outcoupling structure 10 is resin with water absorbability. In other words, resin for forming the first light-outcoupling structure 10 is resin with water absorbability. In this case, the uneven structure 11 and the transparent cover layer 12 may be made of resin, and the resin with water absorbability is used as at least one of resin for the uneven structure 11 and resin for the transparent cover layer 12. The resin with water absorbability may be exemplified by resin including a hydrophilic functional group. To ensure high water absorbability, it is preferable that the hydrophilic functional group remain after the resin is cured. The hydrophilic functional group may include a hydroxyl group, a carboxyl group, a carboxylic group, a sulfone group, a sulfonyl group and a sulfonic group.

An example of the water absorbing material contained in the first light-outcoupling structure 10 is hygroscopic material. In other words, hygroscopic material is contained in resin for forming the first light-outcoupling structure 10. In this case, the uneven structure 11 and the transparent cover layer 12 may be made of resin, and the hygroscopic material is included in as at least one of resin for the uneven structure 11 and resin for the transparent cover layer 12. The hygroscopic material may be particles. An example of the hygroscopic material may be a hygroscopic material having physisorption properties. With regard to the hygroscopic material having physisorption properties, even when the hygroscopic material absorbs water in a production process, water absorbability of the hygroscopic material can be restored by baking. The hygroscopic material may be selected from silica gel, zeolite, and a molecular sieve. Note that, part or a whole of the first light-outcoupling structure 10 may be made of resin with water absorbability including the hygroscopic material. This is one example in which both the hygroscopic material and the resin with water absorbability are used as the water absorbing material. In this case, the water absorbability can be more improved and the reliability can be more improved.

As shown in FIG. 1, in the organic EL element of the implemented embodiment, it is preferable that the second light-outcoupling structure 20 be provided to a surface on the opposite side (outside) of the moisture-proof substrate 1 from the side on which the first light-outcoupling structure 10 is formed. By providing the second light-outcoupling structure 20, total reflection loss between the moisture-proof substrate 1 (glass substrate) and the atmosphere can be suppressed, and therefore the light-outcoupling efficiency can be more improved. Further, the second light-outcoupling structure 20 is a structure with light scattering properties. Therefore, due to the light scattering properties, rays of light emitted from the light emitting layer 3 at various angles are mixed sufficiently, and chromaticity shift depending on view angles can be more reduced. Particularly, in a white organic EL element, the view angle dependency is a very important index for lighting use. In the implemented embodiment, it is possible to obtain the organic EL element with low color differences which mean that color shift depending on a view angle is small. Even in a case of forming the organic EL element in a panel shape, it is possible to obtain the organic EL element which has an excellent light emitting performance and shows a small color shift depending on an angle.

In this regard, the organic EL element (white color) devoid of the second light-outcoupling structure 20 (light scattering structure) is compared with the organic EL element (white color) including the second light-outcoupling structure 20 (light scattering structure) with regard to a color difference (color shift). When the second light-outcoupling structure 20 is not present, the color difference $\Delta u'v'$ is equal to 0.018. In contrast, when the second light-outcoupling structure 20 is present, the color difference $\Delta u'v'$ is equal to 0.004. $\Delta u'v'$ is defined as a maximum value of a root-mean-square $(\Delta u'^{\wedge}2 + \Delta v'^{\wedge}2)^{\wedge}(1/2)$ of shifts from an average in an area in which an absolute value of a view angle of u'v' coordinates of the chromaticity relative to the front line is equal to or less than 80°. Note that, "^" is a symbol representing a multiplier. As described above, by providing the second light-outcoupling structure 20, the view angle dependency can be reduced, and thereby it is possible to obtain light emission with low color differences which mean that color shift depending on a view angle is small.

The second light-outcoupling structure 20 can be obtained by providing an appropriate structure having light scattering properties. For example, the light-outcoupling structure can be easily provided by attaching a light-outcoupling film having a light scattering structure. Alternatively, it is preferable that the light-outcoupling structure be directly formed in the substrate, and this is very effective. For example, it is preferable that the second light-outcoupling structure 20 be formed by roughening the moisture-proof substrate 1. In this case, the number of necessary parts can be reduced, and the productivity can be improved.

The moisture-proof substrate 1 can be roughened by making the surface of the moisture-proof substrate 1 uneven by sandblast or reactive etching, for example. In this case, the process can be easily done by directly roughening the moisture-proof substrate 1. For example, when the substrate is made of glass and the process is performed by sandblast, it is possible to relatively easily perform a formation process of roughening by use of abrasive of #400 aluminum oxide (average particle size is 30 μm). Note that, particles for sandblast may be abrasive such as SiC, alumina, and zircon, and the average particle size may be appropriately adjusted depending on a desired processed shape. The process of roughening may be performed when only the substrate is prepared, that is before the first light-outcoupling structure 10 is formed. The process of roughening may be performed after the first light-outcoupling structure 10 is formed but before the light emitting stack 5 is provided. The process of roughening may be performed after enclosing by the enclosing member 6. However, in a case of using sandblast, residue of abrasive may cause short circuits, and therefore the process is preferably performed after enclosing. Note that, when the second light-outcoupling structure 20 is formed by use of a light scattering film, the second light-outcoupling structure 20 can be formed by attaching the film to the surface of the moisture-proof substrate 1 after enclosing.

FIG. 3 shows an example of a method for producing the organic EL element. FIG. 3 shows a process of producing the organic EL element in which the first light-outcoupling structure 10 is formed more inward from part to be bonded to the enclosing member 6 as with the implemented embodiment of FIG. 1.

Figure 3A:
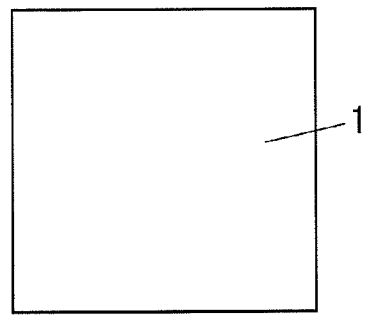
FIG. 3A to FIG. 3F are plans illustrating one example of the method of producing the organic electroluminescence element.
Figure 3D:
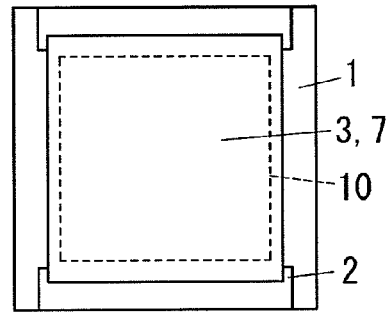
Figure 3B:
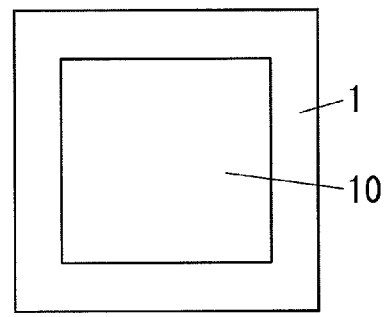

To produce the organic EL element, first, as shown in FIG. 3A the moisture-proof substrate 1 is prepared, and as shown in FIG. 3B the first light-outcoupling structure 10 is formed on the surface of this moisture-proof substrate 1. Note that, the second light-outcoupling structure 20 may be preliminarily provided to the opposite surface of the moisture-proof substrate 1 from the first light-outcoupling structure 10 by roughening. The first light-outcoupling structure 10 may be formed by stacking the uneven structure 11 and the transparent cover layer 12 in this order. As described above, the uneven structure 11 may be formed by applying resin and transferring recesses and protrusions by use of the mold. Further, the transparent cover layer 12 may be formed by applying resin to form a flat surface above recesses and protrusions of the uneven structure 11. Note that, the uneven structure 11 and the transparent cover layer 12 are formed, by patterning, on a region enclosed by part to be bonded to the enclosing member 6. The patterning may be performed by either a method of applying resin onto an entire surface and then removing a layer of resin on a peripheral part, or a method of partially applying resin onto only a central part.

Figure 3E:
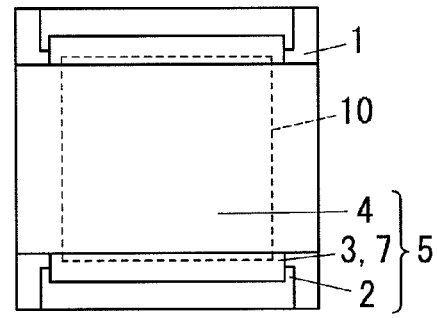
Figure 3C:
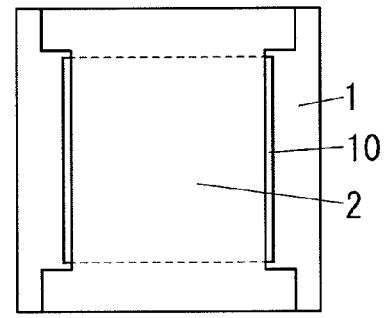

Next, as shown in FIG. 3C, the first electrode 2 is formed by providing a layer. In this regard, a layer of the first electrode 2 is provided to include part present outside the first light-outcoupling structure 10, and thereby is extended outside a region to be enclosed by the enclosing member 6. As a result, part of the first electrode 2 is present outside the enclosing member 6, and therefore it is possible to form a part for receiving power.

Subsequently, as shown in FIG. 3D, layers constituting the charge moving layer 7 and the light emitting layer 3 are stacked in an appropriate order, and thereby the organic layer of the light emitting stack 5 is formed. Thereafter, as shown in FIG. 3E, the second electrode 4 is formed by providing a layer. The second electrode 4 can be formed by providing a layer so as not to be in direct contact with the first electrode 2. In this regard, in the implemented embodiment, a layer of the second electrode 4 is provided to include part present outside the first light-outcoupling structure 10, and thereby is extended outside a region to be enclosed by the enclosing member 6. As a result, part of the second electrode 4 is present outside the enclosing member 6, and therefore it is possible to form a part for receiving power. By stacking the first electrode 2, the light emitting layer 3, the charge moving layer 7, and the second electrode 4, the light emitting stack 5 is formed. The method of forming layers (the first electrode 2, the light emitting layer 3, the charge moving layer 7, and the second electrode 4) of the light emitting stack 5 may be vapor deposition. By the vapor deposition, it is possible to stack thin films efficiently. Further, one or some of these layers may be formed by application or sputtering. The productivity can be improved by use of an appropriate film formation method.

Figure 3F:
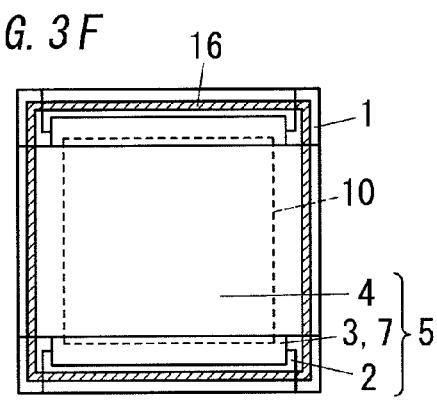

After the light emitting stack 5 is formed, the enclosing member 6 is bonded to the surface of the moisture-proof substrate 1 with adhesive for sealing, and thereby the light emitting stack 5 can be enclosed. In FIG. 3F, part to be bonded to the enclosing member 6 (the hermetically-bonding member 16) is represented by hatching. Enclosing can be realized by glass cap enclosing. Thereafter, when the second light-outcoupling structure 20 has not been formed yet, to form the second light-outcoupling structure 20 on the surface of the moisture-proof substrate 1, the surface of the moisture-proof substrate 1 may be roughened, or a light scattering film may be attached to the surface of the moisture-proof substrate 1. By performing the aforementioned process, the organic EL element shown in the implemented embodiment of FIG. 1 can be obtained.

Figure 4:
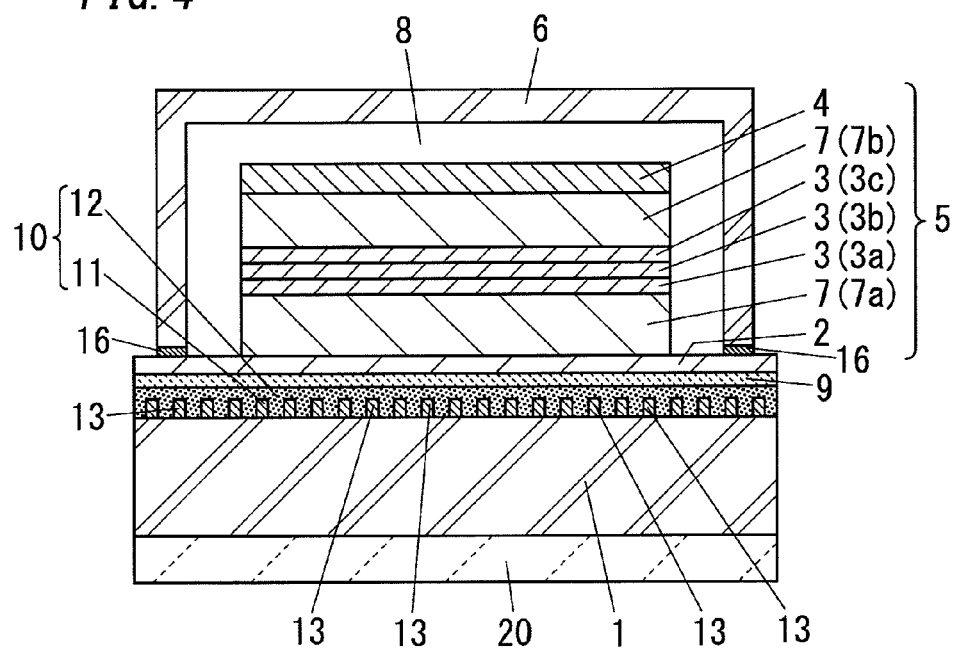
FIG. 4 is a section illustrating an example of the embodiment of the organic electroluminescence element.

FIG. 4 shows another example of the embodiment of the organic EL element. The components common to the present example and the above implemented embodiment are designated by the same reference signs and explanations thereof are omitted. In the implemented embodiment, the first light-outcoupling structure 10 is formed on an entire surface of the moisture-proof substrate 1. Further, the surface (upper surface) of the first light-outcoupling structure 10 (the transparent cover layer 12) is covered with a barrier layer 9. The barrier layer 9 is moisture-proof and light transmissive. As described above, in a preferable embodiment, the barrier layer 9 which is moisture-proof and light transmissive is situated between the first light-outcoupling structure 10 and the first electrode 2. This embodiment can effectively suppress intrusion of moisture through the transparent cover layer 12. When part or a whole of the first light-outcoupling structure 10 is made of resin, outgas derived from the resin may cause deterioration of the light emitting stack 5. However, the barrier layer 9 can prevent intrusion of outgas.

When the first light-outcoupling structure 10 is provided to an entire surface of the moisture-proof substrate 1, the transparent cover layer 12 is formed so as to have part present outside the enclosing member 6. In this case, when the transparent cover layer 12 is made of resin, the transparent cover layer 12 by itself is likely to form an intrusion path of moisture. As result, intrusion of moisture may cause a decrease in the reliability of the element. In view of this, the barrier layer 9 is formed on the surface of the transparent cover layer 12. Thereby, the barrier layer 9 covers the entire surface of the transparent cover layer 12 so that the transparent cover layer 12 is not exposed inside the enclosed region. Consequently, intrusion of moisture can be prevented and thus the deterioration of the element can be prevented. Further, by providing the barrier layer 9, the first electrode 2 is prevented from being in direct contact with the transparent cover layer 12, and therefore deterioration caused by moisture intrusion can be more suppressed.

The barrier layer 9 may be made of a passivation film. Due to this, barrier properties for moisture can be improved. The passivation film may be a passivated film.

The barrier layer 9 may be preferably made of an inorganic film of $SiO_2$, $SiN$, $TiO_2$, or the like, or a layered film of one or more inorganic layers and one or more organic layers. When including an inorganic film, the barrier layer 9 can suppress moisture intrusion.

It is preferable that the barrier layer 9 have a thickness equal to or less than 400/n [nm], where n represents an average refractive index of the barrier layer 9. In this case, the light emitting performance can be improved and nevertheless the barrier properties can be improved. By increasing the thickness of the barrier layer 9, the barrier properties can be increased. However, with regard to the thickness of the barrier layer 9 (passivation film), although occurrence of effects of interference depends on the refractive index or the extinction coefficient of the film, when the thickness is excess, the effects of interference may occur, and this may cause unwanted effects on spectra and view angle dependencies. Further, when the barrier layer 9 has an excess thickness, a large amount of light is absorbed in the barrier layer 9 and the barrier layer 9 tends to be opaque. Hence, it becomes difficult to allow light to emerge, and effects of total reflection may increase. In view of this, the thickness of the barrier layer 9 is preferably set to be in the aforementioned range. The lower limit of the thickness of the barrier layer 9 is not limited particularly, but may be 1/n [nm], 10/n [nm], 100/n [nm], or the like. In particular, the thickness of the barrier layer 9 may be equal to or more than 50 [nm]. Additionally, when the refractive index of the barrier layer 9 is lower than the refractive index of the resin layer, total reflection may occur at an interface between the barrier layer 9 and the resin layer, and thus the efficiency may decrease. In view of this, it is preferable that the refractive index of the barrier layer 9 be higher than the refractive index of the resin layer. Note that, in this case, the resin layer may be the transparent cover layer 12.

Also in the implemented embodiment, it is preferable that the first light-outcoupling structure 10 include water absorbing material which is higher in water absorbability than adhesive for bonding the enclosing member 6 to the moisture-proof substrate 1. In the implemented embodiment, the first light-outcoupling structure 10 is designed to be higher in water absorbability than the hermetically-bonding member 16, and thereby moisture barrier properties of the barrier layer 9 can be reinforced by the first light-outcoupling structure 10. Therefore, deterioration of the organic layer can be suppressed and the reliability can be improved. It is sufficient that the water absorbing material is included in any part of the first light-outcoupling structure 10. Examples of the water absorbing material are same as those described in association with the implemented embodiment of FIG. 1.

The organic EL element of the implemented embodiment can be produced in accordance with the method shown in FIG. 3. The first light-outcoupling structure 10 may be provided to the entire surface without patterning. After that, the barrier layer 9 is formed on the surface of the first light-outcoupling structure 10. The barrier layer 9 may be formed by vapor deposition, sputtering, or application. After formation of the barrier layer 9, the light emitting stack 5 is formed and is enclosed by the enclosing member 6 in a similar manner to the method of FIG. 3.

In the implemented embodiment of FIG. 4, the first light-outcoupling structure 10 can be provided to the entire surface. Hence, in contrast to the implemented embodiment of FIG. 1, the production may be facilitated. Further, in the implemented embodiment of FIG. 4, the first light-outcoupling structure 10 is provided to the entire surface, and thus a level difference caused by the first light-outcoupling structure 10 does not exist. Therefore, in a process of forming a layer, such a layer is prevented from being broken at the level difference. However, in the implemented embodiment of FIG. 1, there is no need to provide the barrier layer 9. In this sense, the production can be facilitated. Further, in the implemented embodiment of FIG. 1, there is no need to provide the barrier layer 9, and therefore it is possible to avoid a decrease in the light-outcoupling efficiency caused by the existence of the barrier layer 9. Note that, in the implemented embodiment of FIG. 1, it is allowed that the barrier layer 9 is provided to the surface of the first light-outcoupling structure 10 (the transparent cover layer 12).

Figure 5:
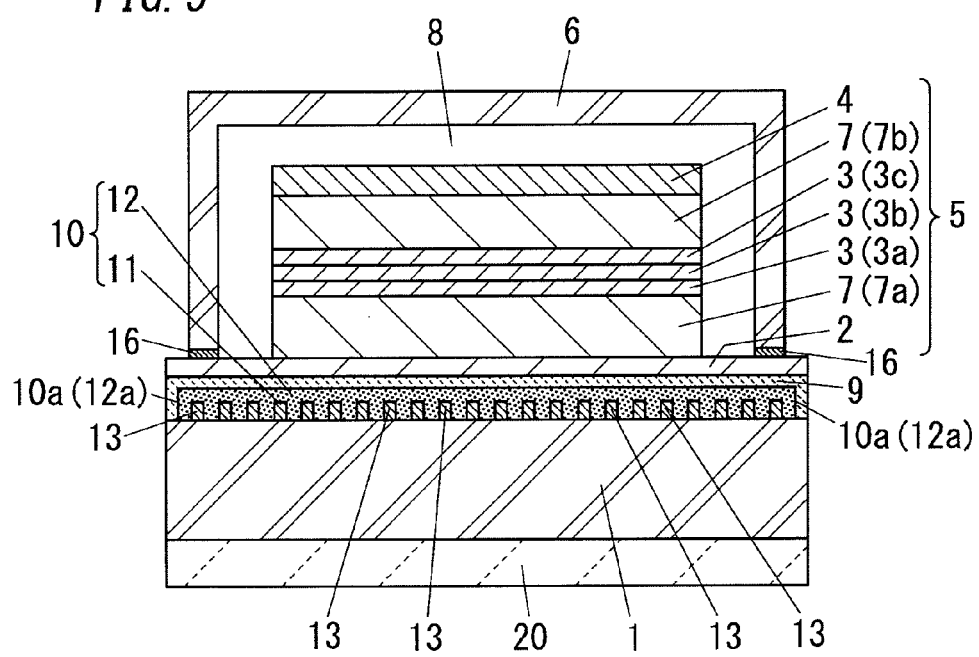
FIG. 5 is a section illustrating an example of the embodiment of the organic electroluminescence element.

FIG. 5 shows another example of the embodiment of the organic EL element. The components common to the present example and the above implemented embodiment are designated by the same reference signs and explanations thereof are omitted. The present implemented embodiment is substantially the same as the implemented embodiment of FIG. 4 but is different from the implemented embodiment of FIG. 4 in a structure of an end part of the barrier layer 9.

In the aforementioned implemented embodiment of FIG. 4, intrusion of moisture can be prevented by the existence of the barrier layer 9. However, a side surface of the end part of the first light-outcoupling structure 10 (the transparent cover layer 12) is exposed outside, and therefore moisture is likely to intrude into the resin layer through this part. In view of this, in the implemented embodiment of FIG. 5, the first light-outcoupling structure 10 is formed so as to be smaller than the moisture-proof substrate 1, and the barrier layer 9 is larger in size in a plan view than the first light-outcoupling structure 10. Thereby, the whole of the first light-outcoupling structure 10 including the side surface is covered with the barrier layer 9. Therefore, the side face 10a (12a) of the end part of the first light-outcoupling structure 10 (the transparent cover layer 12) is not exposed outside. As described above, by covering the first light-outcoupling structure 10 with the barrier layer 9, the first light-outcoupling structure 10 is surrounded by the moisture-proof substrate 1 and the barrier layer 9 and thereby hermetically enclosed. Consequently, the first light-outcoupling structure 10 is not exposed outside, and therefore it is possible to prevent outside moisture from intruding into the resin layer constituting the first light-outcoupling structure 10. Hence, it is possible to produce the organic EL element which can be prevented from deteriorating due to moisture intrusion and can have high reliability.

Also in the implemented embodiment, it is preferable that the first light-outcoupling structure 10 include water absorbing material which is higher in water absorbability than adhesive for bonding the enclosing member 6 to the moisture-proof substrate 1. In the implemented embodiment, the first light-outcoupling structure 10 is designed to be higher in water absorbability than the hermetically-bonding member 16, and thereby moisture barrier properties of the barrier layer 9 can be reinforced by the first light-outcoupling structure 10. Therefore, deterioration of the organic layer can be suppressed and the reliability can be improved. It is sufficient that the water absorbing material is included in any part of the first light-outcoupling structure 10. Examples of the water absorbing material are same as those described in association with the implemented embodiment of FIG. 1.

The organic EL element of the implemented embodiment can be produced in accordance with a similar method to the implemented embodiment of FIG. 4. The first light-outcoupling structure 10 is formed to be smaller than the moisture-proof substrate 1 by patterning. In this regard, it is preferable that the first light-outcoupling structure 10 be formed to be slightly smaller than the moisture-proof substrate 1. By doing so, the light emitting area can be increased as possible. Subsequently, the barrier layer 9 is formed over the surface of the moisture-proof substrate 1 so as to cover the whole of the first light-outcoupling structure 10. Note that, the barrier layer 9 is formed so that the barrier layer 9 is not broken at the end part of the first light-outcoupling structure 10. By doing so, it is possible to hermetically enclose the first light-outcoupling structure 10 without exposing the first light-outcoupling structure 10 outside. For example, the barrier layer 9 may be provided to the entire surface of the moisture-proof substrate 1. After formation of the barrier layer 9, the light emitting stack 5 is formed and is enclosed by the enclosing member 6 in a similar manner to the method of FIG. 3.

Like the implemented embodiment of FIG. 4, the implemented embodiment of FIG. 5 can give advantages that the production can be facilitated and the breakage at the level difference can be suppressed in contrast to the implemented embodiment of FIG. 1. Further, the level of the accuracy required for patterning of the resin layer in the process of forming the first light-outcoupling structure 10 can be lowered, and therefore the degree of freedom of design of the device can be increased and the production cost can be lowered.

In a process of producing the organic EL element, an organic EL element connection member in which multiple organic EL elements are formed on the surface of the moisture-proof substrate 1 to be connected to each other may be produced, and thereafter the moisture-proof substrate 1 may be separated, and thereby the individual organic EL elements are obtained. Also in this case, in the organic EL elements of the individual implemented embodiments, the production can be done efficiently. The produced organic EL element has the excellent light-outcoupling efficiency with regard to white light emission, and has the lowered view angle dependency.

In the organic EL element, by optimizing the first light-outcoupling structure 10, the light-outcoupling efficiency can be more improved. Hereinafter, with reference to FIG. 6 to FIG. 11, preferable embodiments of the first light-outcoupling structure 10 are described. In the embodiments described in the following, the barrier layer 9 is not provided. However, the barrier layer 9 may or may not be provided. Further, the second light-outcoupling structure 20 may or may not be provided. However, it is preferable that the second light-outcoupling structure 20 be provided. Note that, in the following, the first light-outcoupling structure 10 is merely referred to as a light-outcoupling structure 10.

Figure 6:
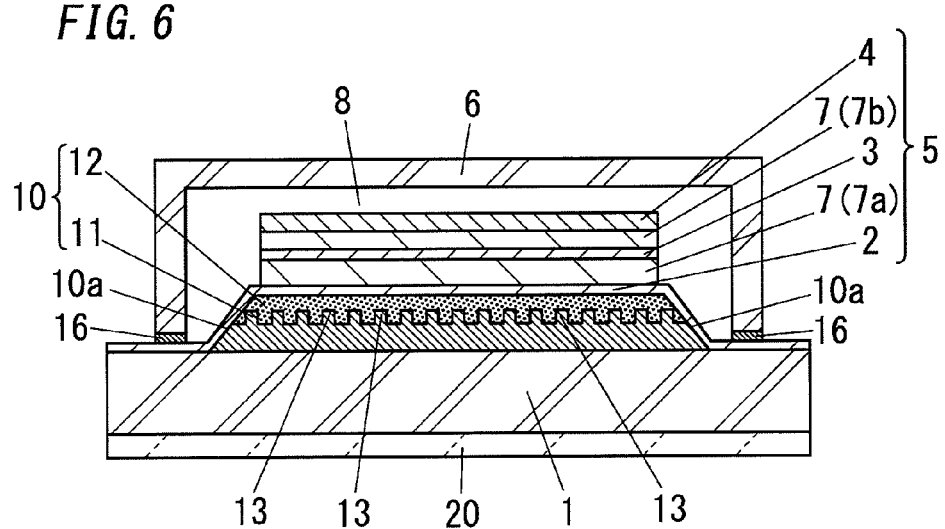
FIG. 6 is a section illustrating an example of the embodiment of the organic electroluminescence element.

FIG. 6 shows another example of the embodiment of the organic EL element. The components common to the present example and the above implemented embodiment are designated by the same reference signs and explanations thereof are omitted.

It is preferable that the light-outcoupling structure 10 has the side face 10a defined as an inclined face which inclines inward from a direction perpendicular to a surface of the moisture-proof substrate 1. In this case, it is possible to prevent the first electrode 2 and the extended part thereof from being separated at the level difference or thinned, and thereby a decrease in the conduction connectability can be suppressed. When the side face 10a of the light-outcoupling structure 10 is an inclined face, adhesiveness with the first electrode 2 can be improved in contrast to a case where the side face 10a of the light-outcoupling structure 10 is a face perpendicular to the surface of the substrate.

Therefore, the reliability can be improved. In the implemented embodiment of FIG. 6, the light-outcoupling structure 10 has a layered structure in which the uneven layer serving as the uneven structure 11 and the transparent cover layer 12 are stacked. Further, the side face 10a defined as an edge face of the layered structure of the uneven layer and the transparent cover layer 12 is an inclined face. In the light-outcoupling structure 10, a side face of the uneven layer is an inclined face. A side face of the transparent cover layer 12 is an inclined face. If the transparent cover layer 12 is not provided, the light-outcoupling structure 10 may be constituted by only the uneven layer (the uneven structure 11). In this case, the side face of the uneven layer may be an inclined face. Alternatively, if the whole of the uneven structure 11 including the side face of the uneven structure 11 is covered with the transparent cover layer 12, the side face of the light-outcoupling structure 10 may be defined as only the side face of the transparent cover layer 12. In this case, the side face of the transparent cover layer 12 may be an inclined face. The inclined face may be interpreted as a tapered surface.

In FIG. 6, the side face 10a of the light-outcoupling structure 10 is a flat surface. The side face 10a of the light-outcoupling structure 10 may be a curved surface. The side face 10a of the light-outcoupling structure 10 is a convex surface which is curved outward, or a concave surface which is curved inward.

An inclined angle of the side face 10a of the light-outcoupling structure 10 is not limited particularly. However, it is preferable that an angle of the side face 10a of the light-outcoupling structure 10 to the surface of the moisture-proof substrate 1 be equal to or less than 85 degrees. In this case, the breakage at the level difference can be more suppressed. The angle of the side face 10a of the light-outcoupling structure 10 to the surface of the moisture-proof substrate 1 is preferably equal to or less than 80 degrees, and is more preferably equal to or less than 70 degrees. However, when this angle is excessively small, the bottom of the light-outcoupling structure 10 becomes excessively large. The angle of the side face 10a of the light-outcoupling structure 10 to the surface of the moisture-proof substrate 1 may be equal to or more than 25 degrees. The angle of the side face 10a of the light-outcoupling structure 10 to the surface of the moisture-proof substrate 1 is defined as an angle of a straight line connecting an upper end and a lower end of the side face 10a to the surface of the moisture-proof substrate 1. Note that, when the side face 10a of the light-outcoupling structure 10 is not an inclined face but is perpendicular to the surface of the moisture-proof substrate 1, the angle of the side face 10a of the light-outcoupling structure 10 to the surface of the moisture-proof substrate 1 is 90 degrees.

Figure 7:
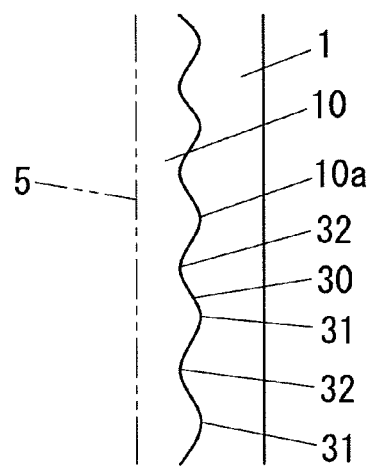
FIG. 7 is an enlarged plan illustrating an example of the embodiment of the organic electroluminescence element.

FIG. 7 shows another example of the embodiment of the organic EL element. The components common to the present example and the above implemented embodiment are designated by the same reference signs and explanations thereof are omitted. FIG. 7 shows an enlarged plan view of the end part of the organic EL element. Note that, to clearly show the structure of the element, the extended part of the first electrode 2 and the enclosing member 6 are not illustrated. However, the organic EL element may include these components. In FIG. 7, an outline of the light emitting stack 5 is indicated by two-dotted lines.

It is preferable that the light-outcoupling structure 10 has the side face 10a including a side uneven structure 30 which is partially protruded and recessed laterally in a plan view of the organic electroluminescence element. In this case, the first electrode 2 is formed so as to be shaped along the surface of the light-outcoupling structure 10 which is partially protruded and recessed laterally. Therefore, it is possible to improve adhesiveness between the light-outcoupling structure 10 and the first electrode 2. Further, when the side uneven structure 30 is provided, recesses and protrusions of the side uneven structure 30 give light scattering properties, and the light-outcoupling efficiency can be improved.

In the implemented embodiment of FIG. 7, the side uneven structure 30 is provided to the light-outcoupling structure 10. The side uneven structure 30 includes at least one side protruded part 31 which is protruded laterally, and at least one side recessed part 32 which is recessed laterally. The side uneven structure 30 may have a structure in which parts protruded laterally and parts recessed laterally are arranged alternately.

In the implemented embodiment of FIG. 7, the side face 10a of the light-outcoupling structure 10 may be a face perpendicular to the surface of the moisture-proof substrate 1. Alternatively, the side face 10a of the light-outcoupling structure 10 may be an inclined face which inclines inward from the direction perpendicular to the surface of the moisture-proof substrate 1. In a preferable embodiment of the light-outcoupling structure 10, the side face 10a thereof is an inclined face as with FIG. 6, and the side face 10a thereof includes the side uneven structure 30 as with FIG. 7. Thus, adhesiveness with the first electrode 2 can be improved, and it is possible to produce the organic EL element excellent in the light-outcoupling efficiency.

FIG. 7 shows an example in which the side uneven structure 30 has a wavy shape. The shape of the side uneven structure 30 is not limited to such a wavy shape. For example, the side uneven structure 30 has a rectangular wave shape. However, to reduce occurrence of breakage at level differences, it is preferable that the side uneven structure 30 have a structure including corners which are not sharp but curved. In the side uneven structure 30 in a wavy shape, the corners thereof are curved.

In the side uneven structure 30, the side protruded part 31 and the side recessed part 32 may have the same width. In this case, an occupation ratio of side protruded parts 31 in the whole can be made to be equal to an occupation ratio of side recessed parts 32 in the whole, and therefore the light-outcoupling efficiency can be improved. The width of the side protruded part 31 and the width of the side recessed part 32 are defined as a dimension of the side protruded part 31 and a dimension of the side recessed part 32 in a direction perpendicular to a direction in which the side protruded part 31 is protruded, respectively. In FIG. 7, the widths of these can be represented by a distance in a length direction. Note that, the width of the side protruded part 31 may be larger or smaller than the width of the side recessed part 32.

An uneven dimension of the side uneven structure 30 may be smaller than the width of the side protruded part 31 and the width of the side recessed part 32. When the uneven dimension is excessively large, the layer is likely to be broken at the level difference or the layer is likely to include useless part. The uneven dimension of the side uneven structure 30 is defined as a distance between the downmost point of the side recessed part 32 and the uppermost point of the side protruded part 31 in a direction in which the side protruded part 31 is protruded. In FIG. 7, the uneven dimension of the side uneven structure 30 is represented by a distance in a width direction. Note that, the uneven dimension of the side uneven structure 30 may be larger than the width of the side protruded part 31 and the width of the side recessed part 32.

When the side uneven structure 30 is provided, it is preferable that the outer limit of the light emitting stack 5 be more inward than the downmost point of the side recessed part 32. In this case, it is possible to obtain stable light emission.

It is preferable that an average pitch of protrusions and recesses of the side uneven structure 30 be greater than 0.3 μm and be less than 10 μm. In this case, the adhesiveness with the first electrode 2 and the light-outcoupling efficiency can be more improved. The average pitch of protrusions and recesses may be defined as an average of a distance between centers of adjacent two side protruded parts 31 in a direction perpendicular to the protrusion direction of the side protruded part 31.

Figure 8:
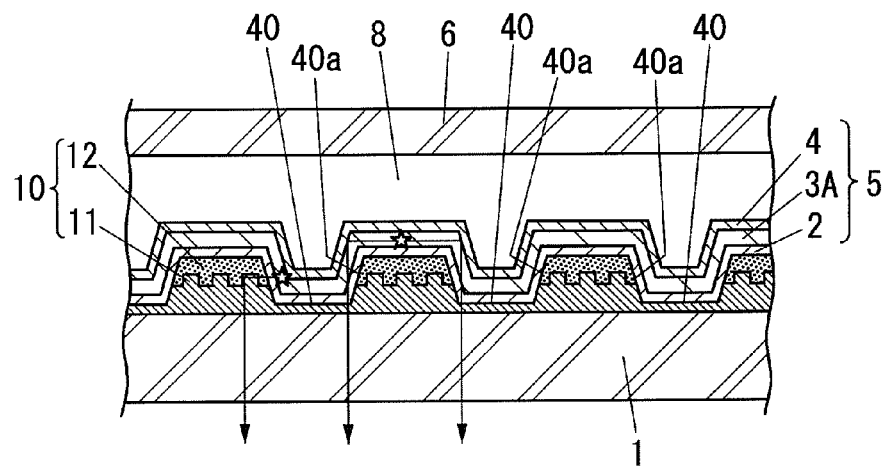
FIG. 8 is a section illustrating an example of the embodiment of the organic electroluminescence element.

FIG. 8 shows another example of the embodiment of the organic EL element. The components common to the present example and the above implemented embodiment are designated by the same reference signs and explanations thereof are omitted. In FIG. 8, the light-outcoupling structure 10 includes multiple recessed portions 40. In FIG. 8, a stack between the first electrode 2 and the second electrode 4 is illustrated as an organic layer 3A. This organic layer 3A may be a stack of the light emitting layer 3 and the charge moving layer 7. The organic layer 3A includes at least the light emitting layer 3.

It is preferable that the light-outcoupling structure 10 includes the recessed portion 40 which is formed in the surface facing the first electrode 2 to be deeper than the recessed part of the uneven structure 11 and the first electrode 2 is formed on the surface of the light-outcoupling structure 10 so as to be shaped along an inner face of the recessed portion 40. Due to this structure, a total area of the organic layer 3A becomes larger than that in a case where the recessed portion 40 is not provided, and therefore a total amount of light emission can be increased. Further, when the second electrode 4 is formed as a reflective electrode, light emitted laterally can be reflected by the second electrode 4 and thereby can emerge outside. Thus, the light-outcoupling efficiency can be more improved. Even if the second electrode 4 is formed as being light transmissive and a reflective layer is provided on the opposite side of the second electrode 4 from the organic layer 3A, the same effect can be obtained.

The recessed portion 40 has a depth which is greater than a protrusion dimension of a protruded part of the uneven structure 11. The recessed portion 40 has a width greater than the width of a protruded part or a recessed part of the uneven structure 11. By forming a macro optical structure, the light-outcoupling efficiency can be improved.

The light emitting stack 5 is preferably formed along the inner shape of the recessed portion 40. In FIG. 8, the first electrode 2 is formed on the surface of the light-outcoupling structure 10 so as to be shaped along the inner face of the recessed portions 40. The first electrode 2 is recessed at the positions of the recessed portions 40. Further, the organic layer 3A is formed on the surface of the first electrode 2 so as to be shaped along the shape of the recessed portions 40. The organic layer 3A is recessed at the positions of the recessed portions 40. In this regard, layers constituting the organic layer 3A may be recessed along the shape of the recessed portions 40. Further, the second electrode 4 is formed on the surface of the organic layer 3A so as to be shaped along the shape of the recessed portions 40. The second electrode 4 is recessed at the positions of the recessed portions 40. Consequently, the light emitting stack 5 is recessed at the positions of the recessed portions 40. In other words, the light emitting stack 5 has a wavy shape. As described above, the light emitting stack 5 is formed along the inner face of the recessed portion 40, and therefore the light-outcoupling efficiency can be improved.

It is preferable that a side face 40a of the recessed portion 40 of the light-outcoupling structure 10 be an inclined face. In this regard, the inclined face means a face inclined inward from a direction perpendicular to the surface of the moisture-proof substrate 1. When the side face 40a of the recessed portion 40 is the inclined face, the light-outcoupling efficiency can be more improved. When the side face 40a of the recessed portion 40 is the inclined face, an angle of the side face 40a of the recessed portion 40 to the surface of the moisture-proof substrate 1 may be similar to the angle of the side face 10a of the light-outcoupling structure 10, and, for example, is preferably equal to or less than 85 degrees, and is more preferably equal to or less than 80 degrees, and is further more preferably equal to or less than 70 degrees, and may be equal to or more than 25 degrees.

As indicated by arrows in FIG. 8, some of rays of light produced by the organic layer 3A travel in a light emerging direction (direction toward the moisture-proof substrate 1) and some of the rays travel laterally. When the recessed portion 40 is present, it is possible to convert the rays traveling laterally into the rays traveling in the light emerging direction by reflection and scattering. In FIG. 8, a ray of light traveling in a lateral direction toward the recessed portion 40 is reflected by the second electrode 4 and thereby is converted into a ray of light traveling outward. Further, a ray of light traveling in a lateral direction toward the uneven structure 11 is scattered by the uneven structure 11 and thereby is converted into a ray of light traveling outward. Therefore, the light-outcoupling efficiency can be improved. Additionally, total reflection loss can be reduced. Improvement of the light-outcoupling efficiency caused by the recessed portion 40 is particularly effective to a case where the light-outcoupling structure 10 including the uneven structure 11 is provided.

Figure 9:
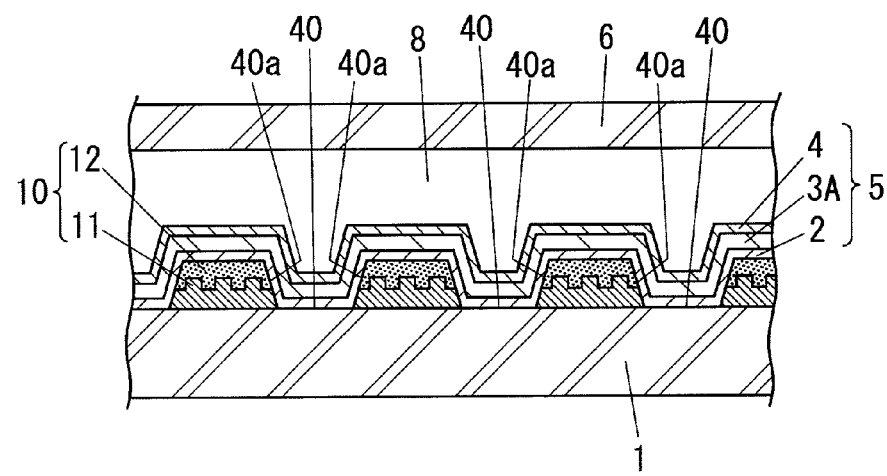
FIG. 9 is a section illustrating an example of the embodiment of the organic electroluminescence element.

FIG. 9 shows another example of the embodiment of the organic EL element. The components common to the present example and the above implemented embodiment are designated by the same reference signs and explanations thereof are omitted. The implemented embodiment of FIG. 9 is a modification of the implemented embodiment of FIG. 8. In FIG. 9, the recessed portion 40 is made to be deeper, and thereby penetrates through the light-outcoupling structure 10. The implemented embodiment of FIG. 9 may be same as the implemented embodiment of FIG. 8 except the recessed portion 40.

In a preferable embodiment, the recessed portion 40 provided to the light-outcoupling structure 10 penetrates the light-outcoupling structure 10. Due to this embodiment, the light-outcoupling efficiency can be more improved.

In FIG. 9, the light-outcoupling structure 10 does not exist at a position of the recessed portion 40. In other words, the light-outcoupling structure 10 includes a through hole at the position of the recessed portion 40. At the position of the recessed portion 40, the first electrode 2 is in contact with an object beneath the light-outcoupling structure 10. In the implemented embodiment of FIG. 9, at the position of the recessed portion 40, the first electrode 2 is in contact with the moisture-proof substrate 1.

In the implemented embodiments of FIG. 8 and FIG. 9, each recessed portion 40 may be provided as a groove, or a spot. When the recessed portions 40 are provided as spots, the recessed portions 40 may be provided regularly or randomly in a plan view. When the recessed portions 40 are provided randomly, the light scattering properties can be improved. When the recessed portion 40 is provided as a groove, the recessed portion 40 may have a line shape. The recessed portion 40 provided as a groove may be a straight groove or a curved groove.

The depth of the recessed portion 40 may be smaller than the thickness of the transparent cover layer 12 but the depth of the recessed portion 40 may be preferably larger than the thickness of the transparent cover layer 12. In this regard, at the position of the recessed portion 40, the recesses and protrusions of the uneven structure 11 may disappear as a result of the existence of the recessed portion 40. In FIG. 8, the depth of the recessed portion 40 is larger than the thickness of the transparent cover layer 12. In FIG. 9, the depth of the recessed portion 40 may be equal to the thickness of the light-outcoupling structure 10.

It is preferable that a distance between adjacent recessed portions 40 be equal to or shorter than 100 μm. In other words, each width of protruded portions obtained by dividing the light-outcoupling structure 10 by the recessed portions 40 is preferably equal to or less than 100 μm. Due to this, the light-outcoupling efficiency can be improved. The distance between the adjacent recessed portions 40 may be equal to or more than 1 μm. When the distance between the recessed portions 40 becomes excessively short, the recessed portion 40 becomes close in size to the recesses and protrusions of the uneven structure 11, desired effects may be hard to be achieved. In more preferably, the width of the protruded portions obtained by division by the recessed portion 40 is in a range of 1 to 10 μm.

It is preferable that the width of the recessed portion 40 be equal to or less than 100 μm. When the recessed portion 40 has a groove shape, the width of the recessed portion 40 is defined as a width of a groove. When the recessed portion 40 has a spot shape, the width of the recessed portion 40 is defined as a diameter of the recessed portion 40. When the width of the recessed portion 40 is equal to or less than 100 μm, the light-outcoupling efficiency can be more improved. The width of the recessed portion 40 may be equal to or more than 1 μm. When the width of the recessed portion 40 becomes excessively short, the recessed portion 40 becomes close in size to the recesses and protrusions of the uneven structure 11, desired effects may be hard to be achieved. In more preferably, the width of the recessed portion 40 is in a range of 1 to 10 μm. Note that, in the light-outcoupling structure 10, the width of the recessed portion 40 may be almost equal to the width of the protruded portion. In the light-outcoupling structure 10, the width of the recessed portion 40 may be larger than the width of the protruded portion. In the light-outcoupling structure 10, the width of the recessed portion 40 may be smaller than the width of the protruded portion. However, to improve the light-outcoupling efficiency by the light-outcoupling structure 10, it is preferable that the width of the recessed portion 40 be equal to or less than the width of the protruded portion.

In the implemented embodiments of FIG. 8 and FIG. 9, the side face 40a of the recessed portion 40 may include a side uneven structure of the recessed portion 40. This side uneven structure may be same as the side uneven structure 30 of the implemented embodiment of FIG. 7. The side uneven structure of the recessed portion 40 may have a structure in which parts protruded laterally and parts recessed laterally are arranged alternately. When the side face 40a of the recessed portion 40 includes recesses and protrusions, adhesiveness between the first electrode 2 and the light-outcoupling structure 10 can be improved. Further, when the side face 40a of the recessed portion 40 includes recesses and protrusions, the light scattering properties can be given and therefore the light-outcoupling efficiency can be improved. In other words, the side face 40a of the recessed portion 40 may be part of the side face 10a of the light-outcoupling structure 10. This means that the side uneven structure is provided to the side face 10a (40a) of the light-outcoupling structure 10 facing the recessed portion 40. Note that, the side face 40a of the recessed portion 40 may be interpreted as a side face of the light-outcoupling structure 10 in an inside region. The side face 10a of the light-outcoupling structure 10 described with reference to FIG. 7 may be considered to be a side edge surface of the light-outcoupling structure 10.

The implemented embodiments of FIG. 6 to FIG. 9 are characterized in the shape of the light-outcoupling structure (the light-outcoupling structure 10). The implemented embodiments of FIG. 6 and FIG. 7 are characterized in the periphery of the light-outcoupling structure 10. The implemented embodiments of FIG. 8 and FIG. 9 are characterized in the recessed portion 40 inside the light-outcoupling structure 10. Hereinafter, methods of producing such light-outcoupling structures 10 are described.

Figure 10:
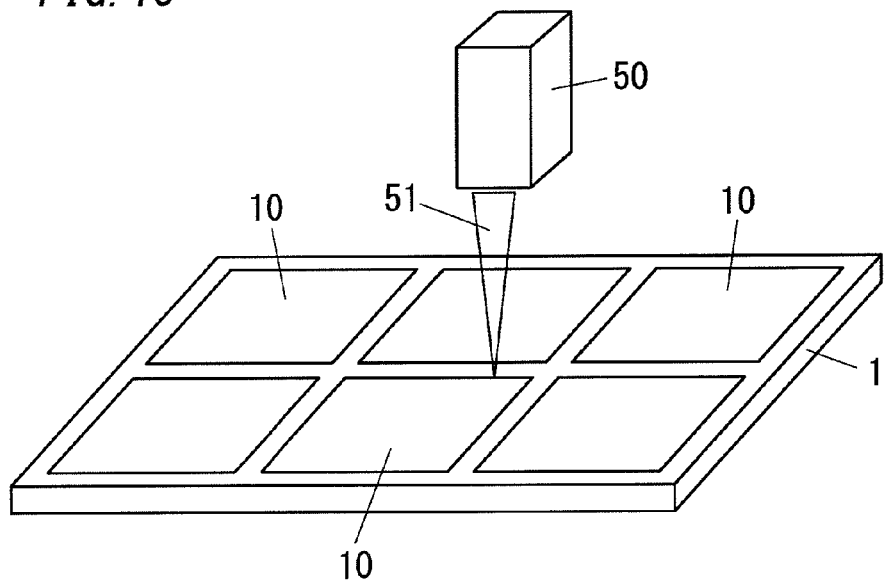
FIG. 10 is a perspective view illustrating an example of the method of producing the organic electroluminescence element.

FIG. 10 shows an example of the method of producing the organic EL element. FIG. 10 illustrates that a layer for the light-outcoupling structure 10 is processed by a laser beam 51. The layer for the light-outcoupling structure 10 is processed by being irradiated with the laser beam 51 by a laser radiation-device 50. FIG. 10 shows a process in which multiple organic EL elements are formed simultaneously. In FIG. 10, the multiple light-outcoupling structures 10 are formed on the moisture-proof substrate 1 larger than a region corresponding to one organic EL element, and the end parts of the layers for the light-outcoupling structures 10 are processed. The inside of the layer for the light-outcoupling structure 10 can be processed by the laser beam 51 in a similar manner. In a process of forming the light-outcoupling structure 10, a large-size layer for the light-outcoupling structures 10 is attached to the moisture-proof substrate 1 and then divided into multiple layers individually for the light-outcoupling structures 10 in processing of the end parts of the layers for the light-outcoupling structures 10. In this case, dividing of the large-size layer and processing of the end parts of the layers for the light-outcoupling structure 10 can be performed simultaneously.

It is preferable that the light-outcoupling structure 10 be formed by laser processing. In a case of using the laser processing, it can be easy to form the light-outcoupling structure 10 including the edge part which has an inclined face or an uneven shape. Further, with regard to the laser processing, strict control of shape can be performed, and therefore the light-outcoupling structure 10 can be formed easily at low cost. The light-outcoupling structure 10 may be formed by wet patterning including cleaning, mask control, and photolithography. However, in the laser processing, it is possible to perform strict control on the tapered shape. Laser patterning is effective to patterning accuracy.

The processing of the layer for the light-outcoupling structure 10 may be performed by use of the laser after the layer for the light-outcoupling structure 10 is provided to the surface of the moisture-proof substrate 1. The processing of the layer for the light-outcoupling structure 10 is preferably done before the formation of the light emitting stack 5. The light-outcoupling structure 10 may be made of resin, and therefore a laser suitable for processing of resin is preferably used. By use of the laser processing, it is possible to form an inclined face easily and precisely. By use of the laser processing, it is possible to form the side uneven structure 30 easily and precisely. By use of the laser processing, it is possible to form the recessed portion 40 easily and precisely.

The laser may be selected from appropriate lasers suitable for processing of resin. The laser is preferably configured to emit the laser beam 51. Note that, the laser is not limited to a laser for emitting specific light. The laser may be a gas laser, an excimer laser, and a solid laser, for example. The gas laser may be exemplified by a $CO_2$ laser. The excimer laser may be exemplified by a KrF laser and an XeCl laser. The solid laser may be exemplified by a laser based on fundamental or harmonic of $YVO_4$ or YAG. In a preferable embodiment, an ultraviolet region laser is used. The ultraviolet region laser may be exemplified by an excimer laser, a laser based on third harmonic of $YVO_4$, and a laser based on third harmonic of YAG. Light in an ultraviolet region is well absorbed by resin and causes relatively small thermal influences, and thus the ultraviolet region laser is preferable. In a preferable embodiment, a laser based on pico-second fundamental or second harmonic of $YVO_4$ is used. The laser may emit a short pulse of pico-seconds or femto-seconds. These lasers are preferable because they allow ablation processing based on multi-photon absorption instead of thermal processing.

In the laser processing, at least one of a laser focus position adjuster, an aperture, a beam homogenizer is preferably used. Thus, a desired beam profile can be produced, and therefore it is possible to form the light-outcoupling structure 10 with the side face 10a which has an inclined face, the side uneven structure 30, or the both. The aperture allows cutting off ends of a region of a laser beam where energy densities are relatively weak. The beam homogenizer is an optical element for homogenizing a beam intensity distribution. The size of the side uneven structure (the uneven dimension and the uneven pitch) can be adjusted by controlling a frequency and a scan rate of the laser. To realize practical processing tact, it is preferable to use a high frequency laser. The high frequency is a frequency equal to or more than 500 kHz, for example. The upper limit of the high frequency is not limited particularly, but may be 1 GHz. For example, when the processing is performed at a frequency of 600 kHz and at a scan rate of 6000 mm/s, it is possible to form the side uneven structure 30 having the uneven pitch of 10 μm (pitch of 6000 mm/600 k).

Figure 11:
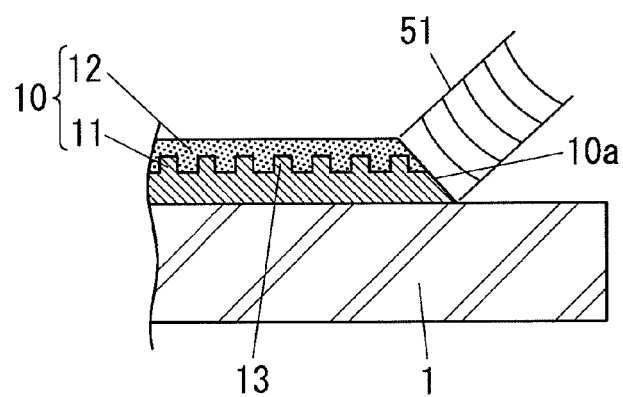
FIG. 11 is a section illustrating an example of the method of producing the organic electroluminescence element.

FIG. 11 illustrates that the end part of the light-outcoupling structure 10 is processed with the laser. As shown in FIG. 11, by being irradiated with the laser beam 51, the side face 10a of the light-outcoupling structure 10 may be formed as an inclined face. Further, the side face 10a of the light-outcoupling structure 10 may be formed as an uneven surface. The recessed portion 40 provided to the light-outcoupling structure 10 may be formed by the same laser processing. In FIG. 11, the laser beam 51 is emitted in a diagonal direction. However, an irradiation angle of the laser beam 51 is not limited to the illustrated angle. The processing for the light-outcoupling structure 10 can be done by adjusting parameters of the laser processing. The moisture-proof substrate 1 may be irradiated with the laser beam 51 in a direction perpendicular to the surface of the moisture-proof substrate 1. The moisture-proof substrate 1 may be irradiated with the laser beam 51 in a direction inclined to the surface of the moisture-proof substrate 1.

The laser processing is effective for processing not only the end part of the light-outcoupling structure 10 but also the inside of the light-outcoupling structure 10. By performing the laser processing on the inside region of the light-outcoupling structure 10 in a plan view, the recessed portion 40 can be formed. In a case of using the laser, by adjusting the output, it is possible to select whether the recessed portion 40 penetrates the light-outcoupling structure 10. By providing the laser beam in a line shape, the recessed portion 40 having a groove shape can be formed. By providing the laser beam in a spot shape, the recessed portion 40 having a spot shape can be formed.

By use of the laser processing, it is possible to easily form the recessed portion 40. By use of the laser processing, it is possible to easily form the inclined face of the side face 40a of the recessed portion 40. By use of the laser processing, it is possible to easily form the uneven surface of the side face 40a of the recessed portion 40. By use of the laser processing, it is possible to easily form various types of shapes by adjusting the beam profile of the laser as described above. The size and the shape of the light-outcoupling structure 10 can be adjusted in view of a combination of the light-outcoupling structure 10 and the second light-outcoupling structure 20.

A lighting device includes the aforementioned organic EL element. This lighting device includes the organic EL element, and therefore it is possible to produce the lighting device excellent in light emitting properties. For example, a light emitting surface of one organic EL element may be formed into a rectangle or square of 10 cm or more in length and 10 cm or more in width, but the shape of the light emitting surface is not limited to this. The lighting device may include multiple organic EL elements which are arranged in plane. The lighting device may include a single organic EL element. The lighting device may include a wiring structure for supplying power to the organic EL element. The lighting device may include a housing for supporting the organic EL element. The lighting device may include a plug for electrically connecting the organic EL element to a power source. The lighting device may be formed into a panel. The lighting device may have a planer shape. The lighting device can be thinner, and therefore it is possible to propose the lighting device for space-saving.

REFERENCE SIGNS LIST

1 Moisture proof Substrate
2 First Electrode
3 Light Emitting Layer
4 Second Electrode
5 Light Emitting Stack
6 Enclosing Member 7 Charge Moving Layer
8 Enclosed Gap
9 Barrier Layer
10 Light-outcoupling Structure (First Light-outcoupling Structure)
11 Uneven Structure
12 Transparent Cover Layer
13 Protruded Part
14 Recessed Part
15 Uneven Section
20 Second Light-outcoupling Structure
30 Side Uneven Structure
31 Side Protruded Part
32 Side Recessed Part
40 Recessed Portion

The invention claimed is:

1. An organic electroluminescence element, comprising:
a moisture-proof substrate being light transmissive;
a light emitting stack including a first electrode being light transmissive, a light emitting layer for emitting at least two rays of light with different emission wavelengths, and a second electrode which are arranged in this order from the moisture-proof substrate; and
a light outcoupler which is provided on a side of the moisture-proof substrate facing the first electrode and has an uneven structure made of material having a refractive index approximately equal to a refractive index of the moisture-proof substrate or lower than the refractive index of the moisture-proof substrate,
the uneven structure including multiple protruded parts having approximately same heights arranged on a plane which is parallel to a surface of the moisture-proof substrate facing the first electrode,
the plane being divided into sections having same areas and forming a matrix,
the multiple protruded parts being irregularly allocated to the sections of the matrix, and
with regard to arbitrary regions each consisting of a predetermined number of the sections of the matrix on the plane, when an area ratio is defined as a ratio of a total area of multiple protruded parts in an arbitrary region to an area of the arbitrary region, and for a given arbitrary region, the area ratio falls within a range of +/−10% deviation from an average of area ratios of all arbitrary regions.

2. The organic electroluminescence element according to claim 1, wherein
the light outcoupler has a side face defined as an inclined face which inclines inward from a direction perpendicular to a surface of the moisture-proof substrate.

3. The organic electroluminescence element according to claim 1, wherein
the light outcoupler has a side face including a side uneven structure which is partially protruded and recessed laterally in a plan view of the organic electroluminescence element.

4. The organic electroluminescence element according to claim 3, wherein
an average pitch of protrusions and recesses of the side uneven structure is greater than 0.3 μm and is less than 10 μm.

5. The organic electroluminescence element according to claim 1, wherein:
the light outcoupler includes a recessed portion which is formed in a surface facing the first electrode to be deeper than a recessed part of the uneven structure; and
the first electrode is formed on the surface of the light outcoupler so as to be shaped along an inner face of the recessed portion.

6. The organic electroluminescence element according to claim 5, wherein
the recessed portion penetrates through the light outcoupler.

7. The organic electroluminescence element according to claim 1, wherein
the light outcoupler includes a transparent covering layer, the transparent covering layer being made of material higher in a refractive index than the moisture-proof substrate and covering the uneven structure.

8. The organic electroluminescence element according to claim 7, wherein
the transparent covering layer is made of resin.

9. The organic electroluminescence element according to claim 1, further comprising an enclosure bonded to the moisture-proof substrate to enclose the light emitting stack, wherein
the light outcoupler is situated to be enclosed by the enclosure in a plan view.

10. The organic electroluminescence element according to claim 1, further comprising a barrier layer situated between the light outcoupler and the first electrode, the barrier layer being moisture-proof and light transmissive.

11. The organic electroluminescence element according to claim 10, wherein
the barrier layer has a thickness equal to or less than 400/n [nm], where n represents an average refractive index of the barrier layer.

12. The organic electroluminescence element according to claim 1, wherein
the uneven structure is formed as a diffraction optical structure.

13. The organic electroluminescence element according to claim 1, further comprising:
an enclosure bonded to the moisture-proof substrate to enclose the light emitting stack; and
a hermetically-bonding composition that bonds the enclosure to the moisture-proof substrate, wherein
the light outcoupler includes water absorbing material which is higher in water absorbability than the hermetically-bonding composition.

14. The organic electroluminescence element according to claim 1, wherein:
the light outcoupler is defined as a first light outcoupler; and
a second light outcoupler including a light scattering structure is provided to an opposite surface of the moisture-proof substrate from the first electrode.

15. The organic electroluminescence element according to claim 14, wherein
the second light outcoupler is a rough surface of the moisture-proof substrate.

16. A lighting device, comprising the organic electroluminescence element according to claim 1.

* * * * *